(12) United States Patent
Ito

(10) Patent No.: US 6,881,963 B2
(45) Date of Patent: Apr. 19, 2005

(54) VIBRATION CONTROL OF AN OBJECT

(75) Inventor: Hiroshi Ito, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/698,528

(22) Filed: Nov. 3, 2003

(65) Prior Publication Data

US 2004/0164253 A1 Aug. 26, 2004

(30) Foreign Application Priority Data

Nov. 8, 2002 (JP) .......................... 2002-325941
Nov. 11, 2002 (JP) .......................... 2002-326651

(51) Int. Cl.$^7$ .............................. F16F 7/10; G01M 7/02
(52) U.S. Cl. ............................ 250/491.1; 250/492.1; 250/492.2; 250/492.22; 267/136; 73/663; 73/662; 73/664
(58) Field of Search ........................ 250/492.2, 492.22, 250/492.1, 491.1; 267/136; 73/662, 663, 664

(56) References Cited

U.S. PATENT DOCUMENTS 5,734,236 A * 3/1998 Motegi .................. 318/114
6,378,672 B1 * 4/2002 Wakui .................. 188/378
6,742,393 B2 * 6/2004 Ito .................. 73/662

FOREIGN PATENT DOCUMENTS

| JP | 5-225734 | 9/1993 |
| JP | 7-83276 | 3/1995 |
| JP | 11-194066 | 7/1999 |

* cited by examiner

Primary Examiner—Nikita Wells
(74) Attorney, Agent, or Firm—Fitzpatrick, Cella, Harper & Scinto

(57) ABSTRACT

An apparatus for controlling motion of an object includes a first actuator for moving the object, an elastic-motion measuring unit for measuring elastic motion of the object, and a control unit for controlling the first actuator based on a result of measurement of the elastic-motion measuring unit. Another apparatus for controlling motion of an object includes a first actuator for moving the object, a second actuator for suppressing elastic motion of the object, and a control unit for controlling the second actuator based on a result of predicting the elastic motion of the object caused by the first actuator.

19 Claims, 20 Drawing Sheets

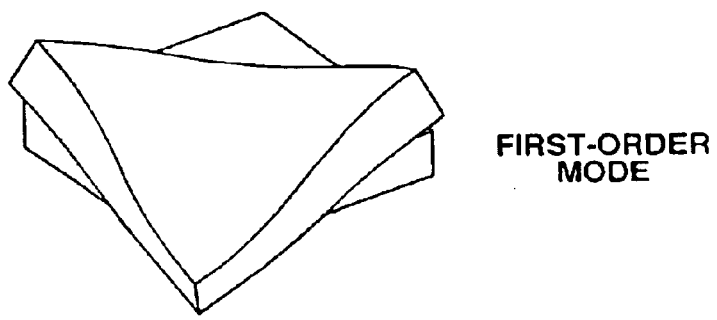
FIG. 14A — FIRST-ORDER MODE
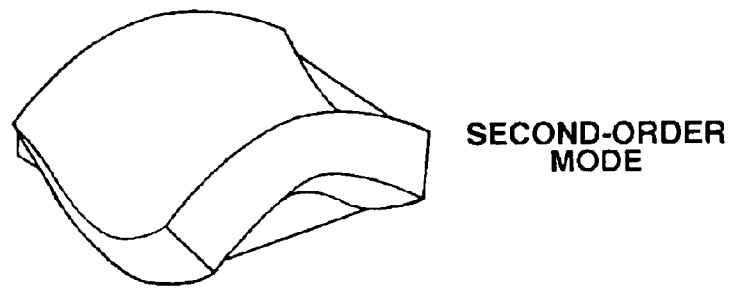
FIG. 14B — SECOND-ORDER MODE
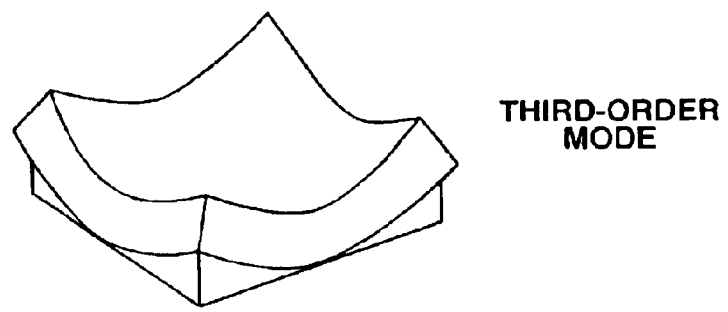
FIG. 14C — THIRD-ORDER MODE
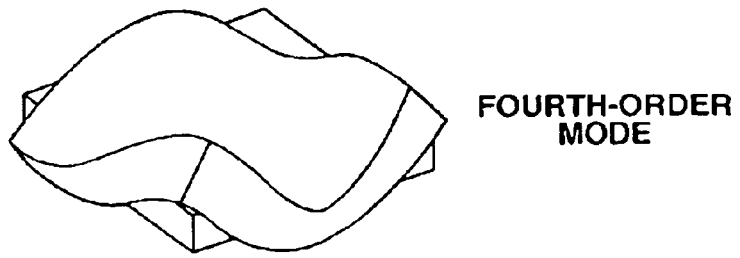
FIG. 14D — FOURTH-ORDER MODE

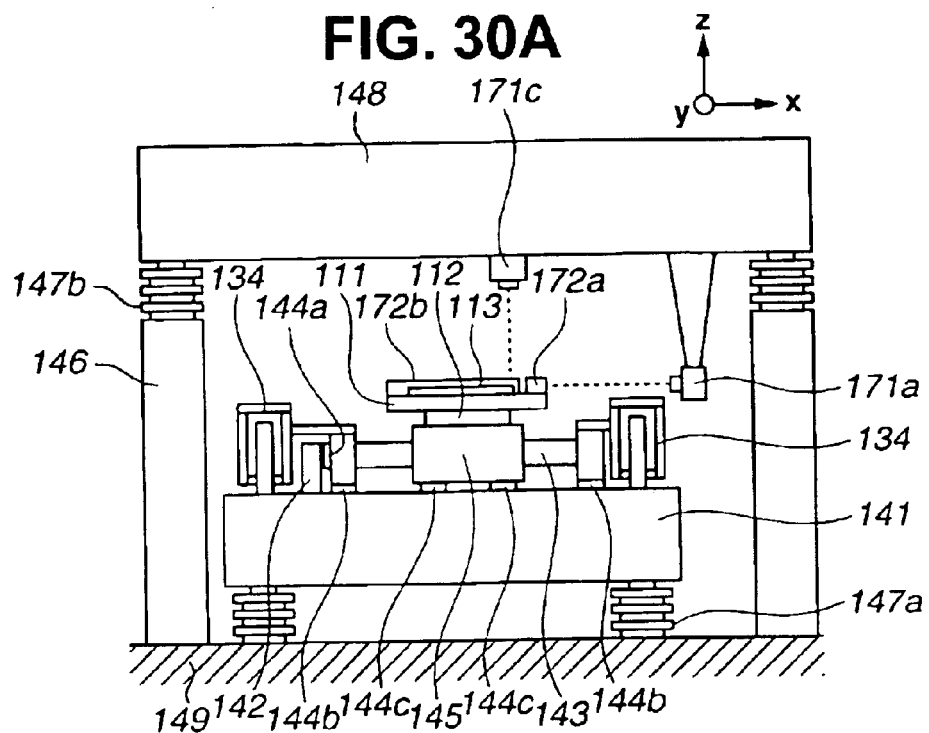
FIG. 30A
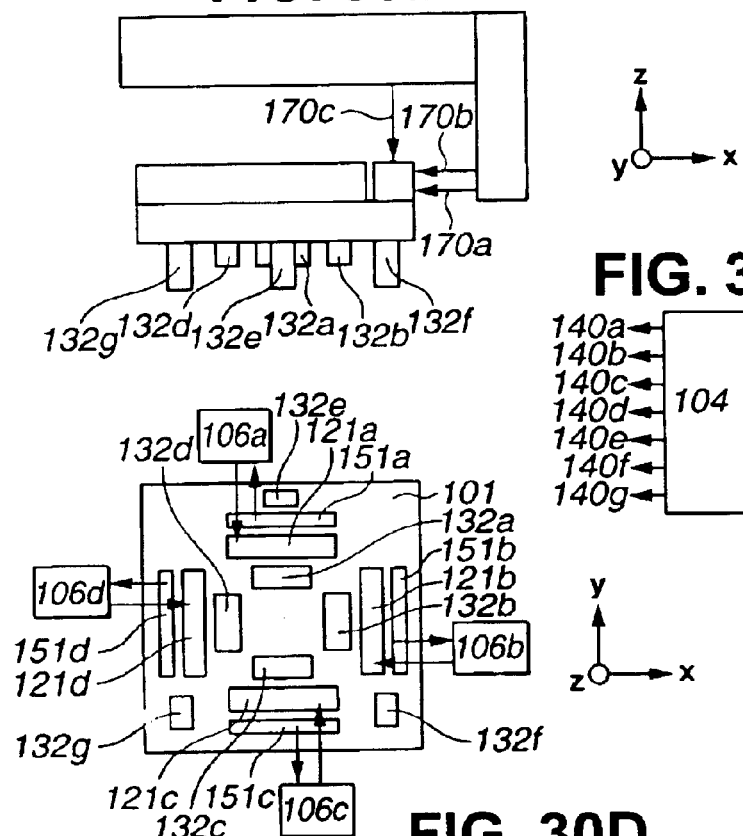
FIG. 30B
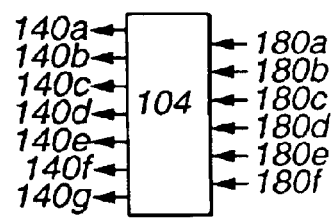
FIG. 30C
FIG. 30D

VIBRATION CONTROL OF AN OBJECT

BACKGROUND OF THE INVENTION

1. Field of the Invention

The present invention relates to a technique for controlling vibration of a movable object in a precision apparatus, such as a semiconductor exposure apparatus, a machine tool, an OA (office automation) apparatus, or the like.

2. Description of the Related Art

Conventional techniques intended to simultaneously suppress a rigid vibration mode and an elastic vibration mode are described, for example, in "An apparatus for controlling a vertical-direction-air-spring-type vibration removing mount" disclosed in Japanese Patent Application Laid-Open (Kokai) No. 7-83276 (1995) (hereinafter termed "reference 1"), and in "A method for controlling multi-mode vibration in a vibration generation mount" disclosed in Japanese Patent Application Laid-Open (Kokai) No. 11-194066 (1999) (hereinafter termed "reference 2").

In reference 1, four position deviations of four driving points of a vibration removing mount from a floor, and four acceleration values on the vibration removing mount are detected. A motion-mode extraction circuit for calculating position deviations and acceleration values for respective motion modes from respective signals representing these position deviations and acceleration values is prepared. A driving signal for each mode is calculated from the obtained position deviations and acceleration values for each motion mode. The calculated driving signal is converted into a driving signal for each air spring using a motion-mode distribution circuit, to drive the air spring. According to this control method, four degrees of freedom, i.e., three degrees of freedom for rigid vibration and one degree of freedom for elastic vibration, are controlled.

In reference 2, in order to control a large number of elastic vibration modes of a vibration generation mount, a method is proposed in which the vibration generation mount is approximated to a model of connection of a finite number of material particles, and elastic vibration is suppressed by feeding back the displacement, the velocity, and the like, of each material particle.

A conventional technique for suppressing elastic vibration of a movable body is described, for example, in "Magnetic disk apparatus" disclosed in Japanese Patent Application Laid-Open. (Kokai) No. 05-225734 (1993) (hereinafter termed "reference 3"). In this technique, piezoelectric elements for driving and detecting elastic vibration are provided at a spring arm of a magnetic disk, and a resistor connecting the piezoelectric elements and a control circuit for changing the value of the resistor are also provided. The value of the resistor is switched between "seek", in which the arm is greatly rotated and moved, and "on-track", in which the arm is slightly moved. Thus, elastic vibration of the spring arm is suppressed during seek, and the spring arm is used as an elastic member during on-track.

A method for suppressing elastic vibration of a beam, instead of a movable body, is described, for example, in "Detection and control of beam vibration using a piezoelectric film" (Nippon Kikai Gakkai Ronbunshu, C, Vol. 63, No. 615, hereinafter termed "reference 4). In this method, as in the above-described reference 3, elastic vibration of a beam is suppressed by bonding piezoelectric elements on both surfaces of a beam, amplifying the voltage of a piezoelectric element for detection, and inputting the amplified voltage to a piezoelectric element for driving.

In the method of reference 1, each of a position measuring device and an acceleration measuring device measures vibration (motion) as a result of synthesizing rigid vibration and elastic vibration. In order to separate elastic vibration and rigid vibration, a motion-mode extraction circuit is necessary. As a result, the configuration of circuitry becomes complicated. A simple square plate is assumed as the vibration removing mount described in reference 1, and a conversion matrix to be used by the above-described conversion circuits has a simple form. In an actual vibration removing mount, however, since other components are also present and vibration modes are complicated, it is not easy to separate motion modes. In reference 1, vibration in a rigid mode and vibration in an elastic mode are detected by the same detector. In the case of reference 1, vibration in the rigid mode has a frequency of several Hz, and vibration in the elastic mode has a frequency of several tens of Hz. Accordingly, in order to detect both of these vibrations, it is necessary to prepare a detector having a wide dynamic range.

In reference 2, vibration as a result of synthesizing elastic vibration and rigid vibration is also detected. In the method of reference 2, in order to realize desired rigid motion, it is also necessary to separate rigid vibration and elastic vibration according to some approach. In the method of reference 2, however, nothing is described with respect to this point. That is, no method for arbitrarily controlling rigid vibration while suppressing elastic vibration is described.

References 3 and 4 disclose methods for suppressing elastic vibration by detecting elastic vibration of an elastic member, and feeding back the measured value to driving means for elastic vibration. Accordingly, in these methods, attenuation characteristics are determined depending on how high the gain of a feedback loop can be made. In the method of reference 3, since no amplifier for supplying electric power is present, too excellent attenuation characteristics cannot be obtained. In the method of reference 4, there is a limitation in the gain of a realizable feedback loop, depending on the positions of piezoelectric elements bonded on an elastic member, the characteristics of the piezoelectric elements, and the like. Accordingly, there is a limitation in the obtained attenuation characteristics. As described above, there is a limitation due to insufficient stability in improvement of attenuation characteristics by feedback control, and required attenuation performance is not always obtained.

SUMMARY OF THE INVENTION

It is an object of the present invention to solve the above-described problems.

It is another object of the present invention to allow very precise control of rigid motion of an object while suppressing elastic motion of the object, without separately extracting rigid motion and elastic motion from motion of the detected object.

According to one aspect of the present invention, the foregoing objects are attained by providing an apparatus for controlling motion of an object. The apparatus includes a first actuator for moving the object, an elastic-motion measuring unit for measuring elastic motion of the object, and a control unit for controlling the first actuator based on a result of measurement of the elastic-motion measuring unit.

According to another aspect of the present invention, an exposure apparatus for exposing a substrate to a pattern of an original comprises the above-described apparatus.

According to still another aspect of the present invention, a device manufacturing method includes a step of using the above-described apparatus.

According to yet another aspect of the present invention, an apparatus for controlling motion of an object includes a first actuator for moving the object, a second actuator for suppressing elastic motion of the object, and a control unit for controlling the second actuator based on a result of predicting the elastic motion of the object by the first actuator.

According to still another aspect of the present invention, an exposure apparatus for exposing a substrate to a pattern of an original comprises the above-described apparatus.

According to still another aspect of the present invention, a device manufacturing method includes a step of using the above-described exposure apparatus.

Other objects, features and advantages of the present invention will be apparent from the following detailed description of the preferred embodiments taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principle of the invention.

FIGS. 14A–14D illustrate elastic vibration modes of a flat plate;

FIGS. 30A, 30B, 30C and 30D are diagrams illustrating the configuration of a twenty-second embodiment of the present invention.

DETAILED DESCRIPTION OF THE PREFERRED EMBODIMENTS

Preferred embodiments of the present invention will now be described in detail in accordance with the accompanying drawings.

In a first basic configuration, a detector for rigid vibration and a detector for elastic vibration are separately prepared. Accordingly, separation between elastic vibration and rigid vibration can be easily realized without using a special circuit, such as a motion-mode extraction circuit. Furthermore, even a complicated elastic mode vibration can be directly detected. Accordingly, the configuration of a control system is simple, and the control system can be easily adjusted. Since detectors are separately prepared for rigid vibration and elastic vibration, it is possible to prepare a detector having a detection range suitable for each vibration.

Figure 1:
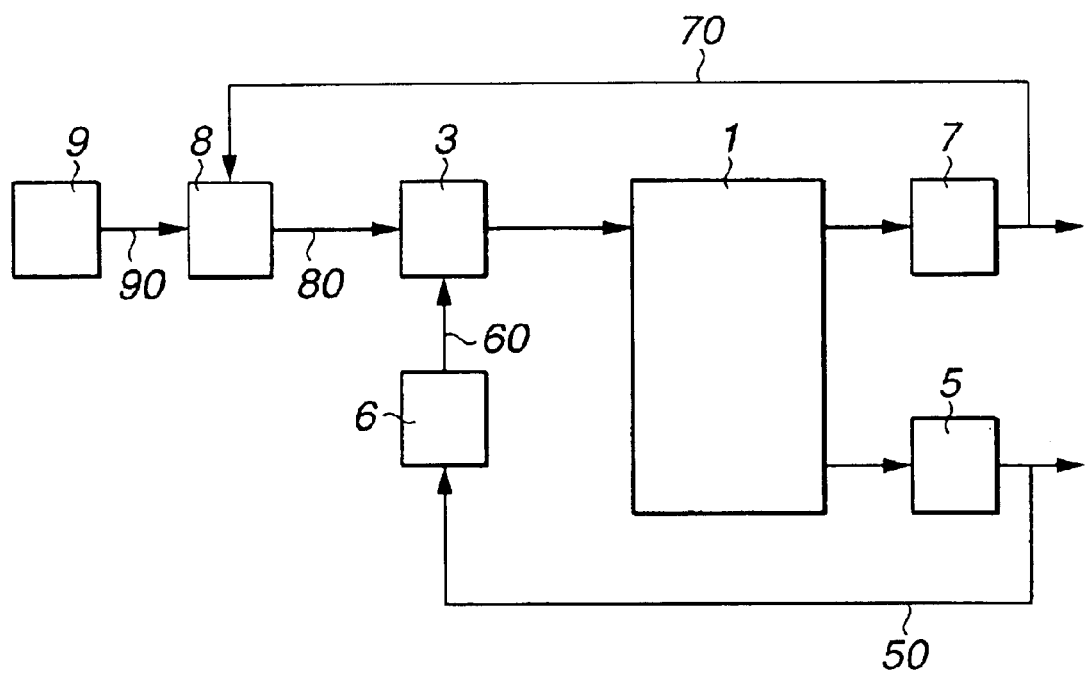
FIG. 1 is a diagram illustrating a first basic configuration.

FIG. 1 illustrates the first basic configuration. In FIG. 1, position-instruction-value generation means 9 generates a target-position instruction value 90 for a movable body 1. Rigid-vibration measuring means 7 measures a rigid body position 70 of the movable body 1. Rigid-vibration control means 8 outputs a rigid-vibration driving-force instruction value 80 using the target-position instruction value 90 and the measured rigid-body position 70. Elastic-vibration measuring means 5 measures elastic vibration 50 of the movable body 1, and outputs the measured elastic vibration 50 to elastic-vibration control means 6. The elastic-vibration control means 6 obtains an elastic-vibration driving-force instruction value 60 for suppressing elastic vibration. Driving means 3 drives the movable body 1 in accordance with the rigid-vibration driving-force instruction value 80 and the elastic-vibration driving-force instruction value 60.

By independently measuring each vibration with separate measuring devices for rigid vibration and for elastic vibration, it is possible to use a measuring device suitable for each vibration and effectively control (for example, suppress) rigid vibration and elastic vibration without using a special circuit, such as a motion-mode extraction circuit.

Figure 2:
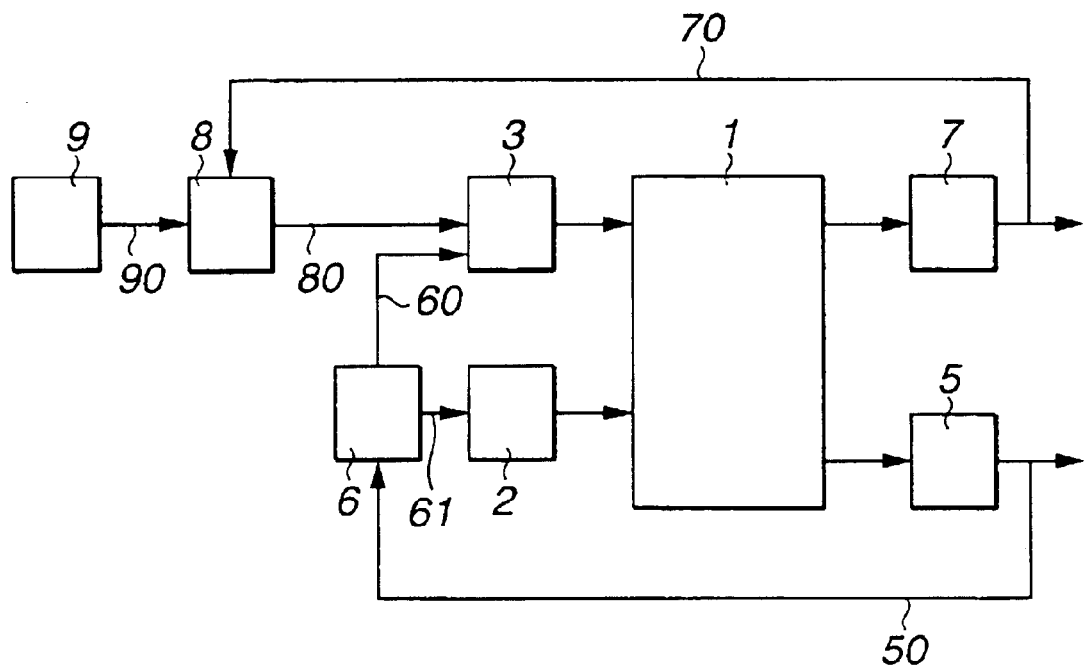
FIG. 2 is a diagram illustrating a second basic configuration.

FIG. 2 is a diagram illustrating a second basic configuration. In the configuration of FIG. 2, elastic-vibration driving means 2 is further added to the configuration of FIG. 1. Elastic vibration so measured by elastic-vibration measuring means 5 is fed back to the elastic-vibration driving means 2. It is thereby possible to provide a performance of suppressing higher-order elastic vibration that cannot be suppressed in the system shown in FIG. 1.

FIGS. 1 and 2 illustrates examples of suppressing elastic vibration by feeding back elastic vibration 50 measured by elastic-vibration measuring means 5. When an external force causing elastic vibration is known, it is possible to suppress elastic deformation by simultaneously generating an internal force to cancel an internal force generated by the external force, using information relating the external force. Each of FIGS. 3–6 proposes a method for effectively suppressing elastic vibration by combining the method for suppressing elastic vibration using such feedforward with the above-described feedback.

Figure 3:
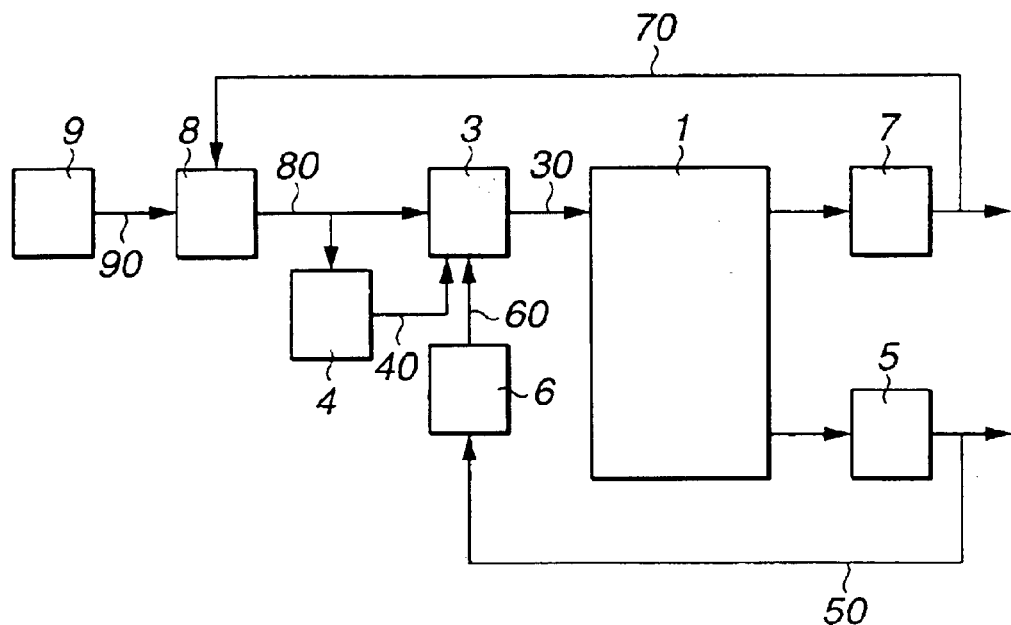
FIG. 3 is a diagram illustrating a third basic configuration.

FIG. 3 illustrates a third basic configuration. The operation of this system will now be described. Position-instruction-value generation means 9 generates a target-position instruction value 90 for a movable body 1. Rigid-vibration measuring means 7 measures a rigid-body position 70 of the movable body 1. Rigid-vibration control means 8 outputs a driving-force instruction value 80 using the target-position instruction value 90 and the rigid-body position 70. Elastic-vibration measuring means 5 measures elastic vibration 50 of the movable body 1, and outputs the measured elastic vibration 50 to elastic-vibration control means 6. The elastic-vibration control means 6 obtains an elastic-vibration driving-force instruction value 60 for suppressing elastic vibration. An elastic-vibration compensator 4 obtains an external force applied to the movable body 1 from the rigid-vibration driving-force instruction value 80, determines an internal force generated in the movable body 1 by the external force, and causes driving means 3 to generate a force to cancel deformation of the movable body 1 caused by the internal force. The driving means 3 drives the movable body 1 in accordance with the rigid-vibration driving-force instruction value 86, the elastic-vibration driving-force instruction value 60, and a driving instruction value 40 output from the elastic-vibration compensator 4.

Figure 4:
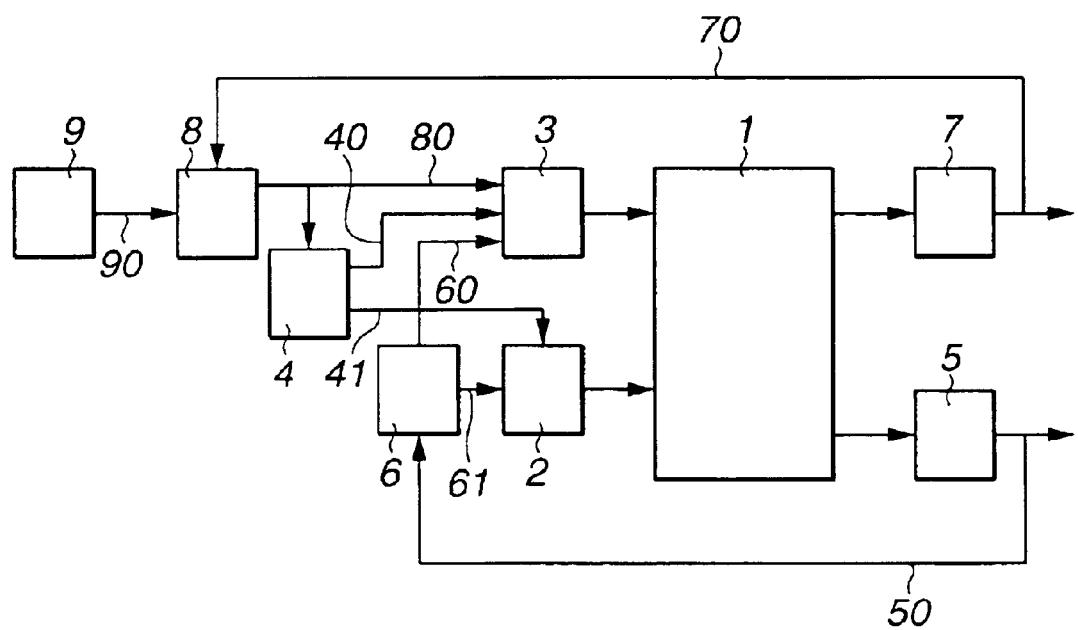
FIG. 4 is a diagram illustrating a fourth basic configuration.

FIG. 4 illustrates a fourth basic configuration. In this configuration, elastic-vibration driving means 2 is further added to the configuration of FIG. 3. In this system, in addition to suppressing elastic vibration by a feedback system, the effect of suppressing elastic vibration is improved by feeding forward the rigid-vibration driving-force instruction value 80 to the driving means 3 and the elastic-vibration driving means 2.

Figure 5:
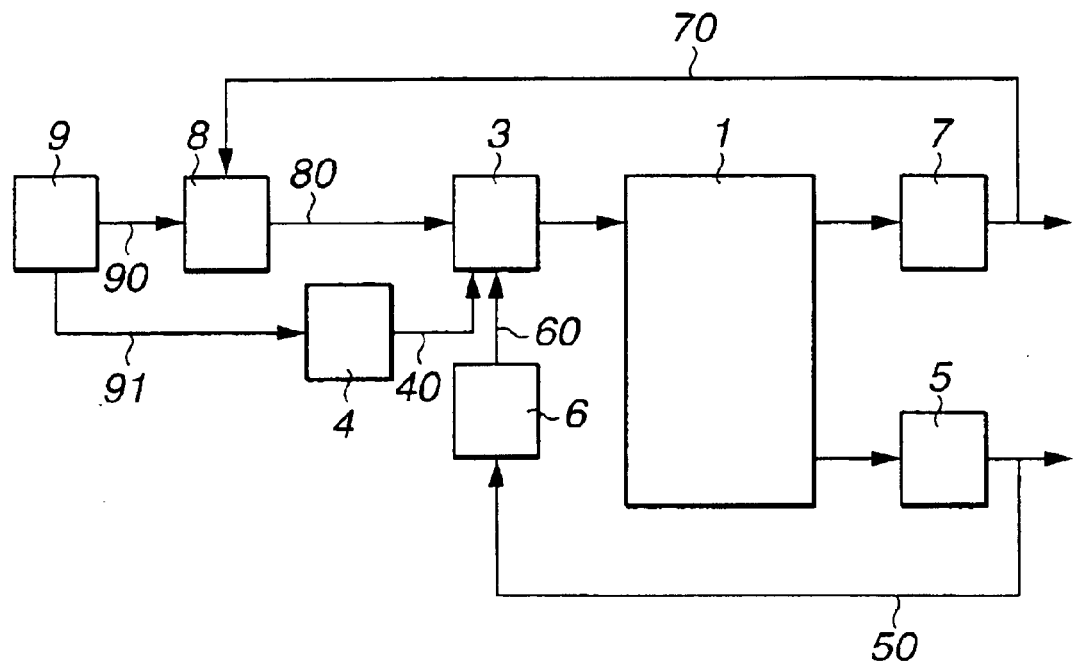
FIG. 5 is a diagram illustrating a fifth basic configuration.
Figure 6:
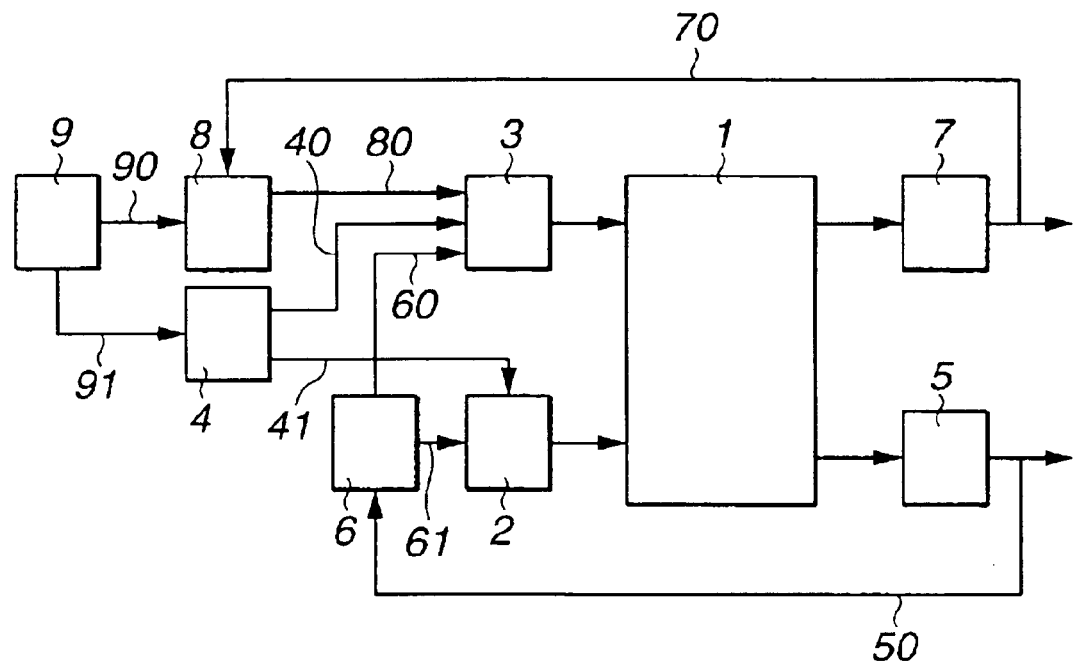
FIG. 6 is a diagram illustrating a sixth basic configuration.

FIGS. 5 and 6 illustrate fourth and fifth basic configurations, respectively. Although these systems are configured with the same conception as the systems shown in FIGS. 3 and 4, respectively, these systems differ from the systems shown in FIGS. 3 and 4 in that a signal used for feedforward is used for control by estimating a driving external force from a target-acceleration instruction value 91, instead of using the driving-force instruction value 80. It can be considered that the rigid-vibration driving-force instruction value 80 and a value obtained by multiplying the target-acceleration instruction value 91 by the mass of the movable body have substantially the same value in the following conditions: (1) connection rigidity between the movable body and another member connected to the movable body is sufficiently low; and (2) the response property of a control system for controlling the movable body is sufficient.

As is apparent from the system shown in FIG. 3, in the system in which the elastic-vibration compensator 4 is added, the open-loop transfer function differs from that of the system shown in FIG. 1. By incorporating the elastic-vibration compensator 4, since the response property is superior, there is the possibility that the characteristic of a high-frequency region of the entire system is greatly changed, thereby degrading the stability of the system. On the other hand, the system shown in FIG. 5, in which the target-acceleration instruction value 91 is used instead of the rigid-vibration driving-force instruction value 80, has the same open-loop transfer function as the system shown in FIG. 1, so that the stability of the system is not changed. As described above, when a problem in stability arises in the system shown in FIG. 3 or 4, a system having excellent stability can be obtained by adopting the system shown in FIG. 5 or 6, respectively.

First Embodiment

Figure 7:
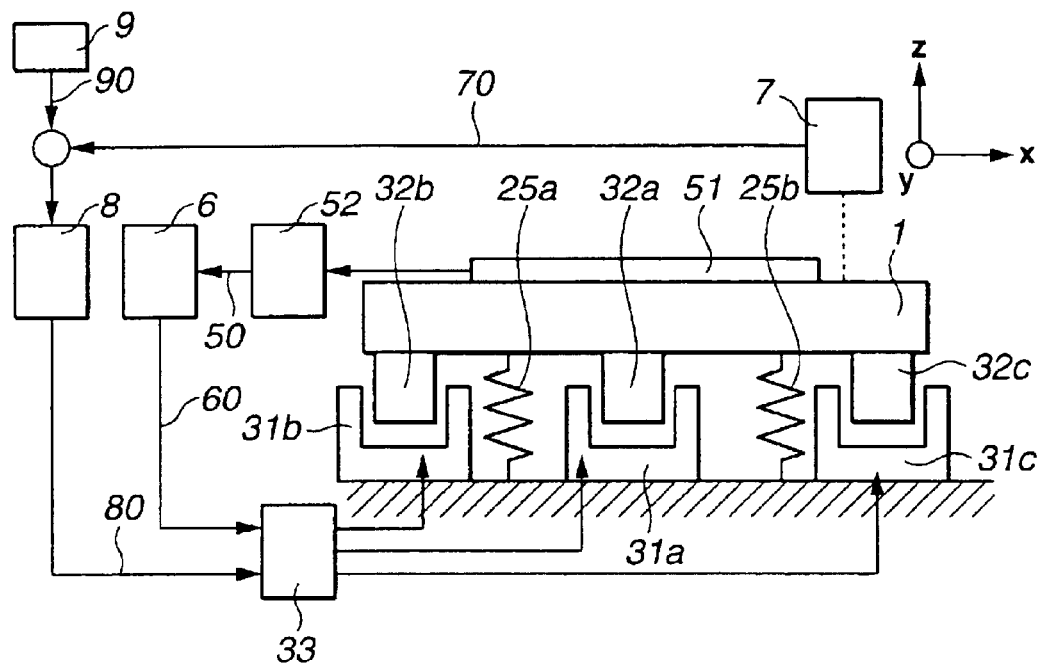
FIG. 7 is a diagram illustrating the configuration of a first embodiment of the present invention.
Figure 13A:
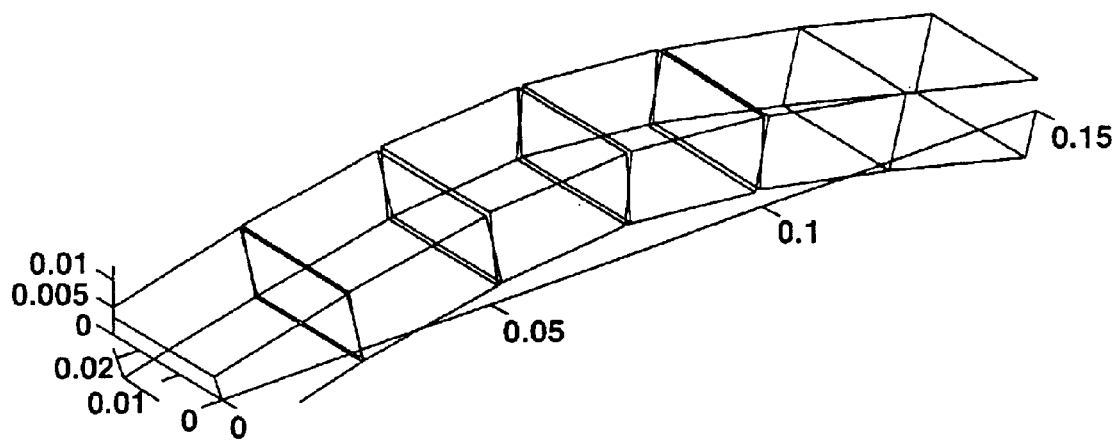
FIGS. 13A–13C are diagrams illustrating elastic vibration modes of a beam.
Figure 13B:
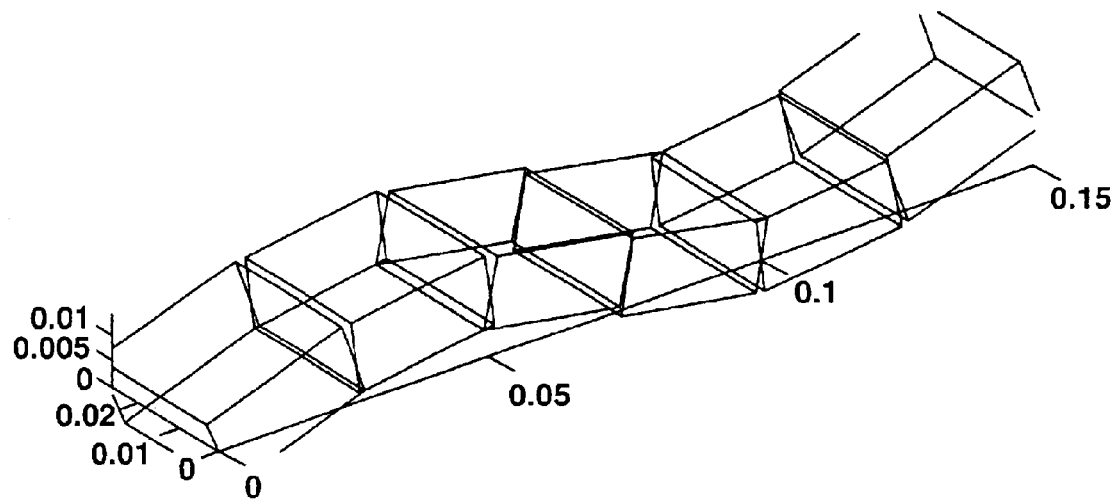
Figure 13C:
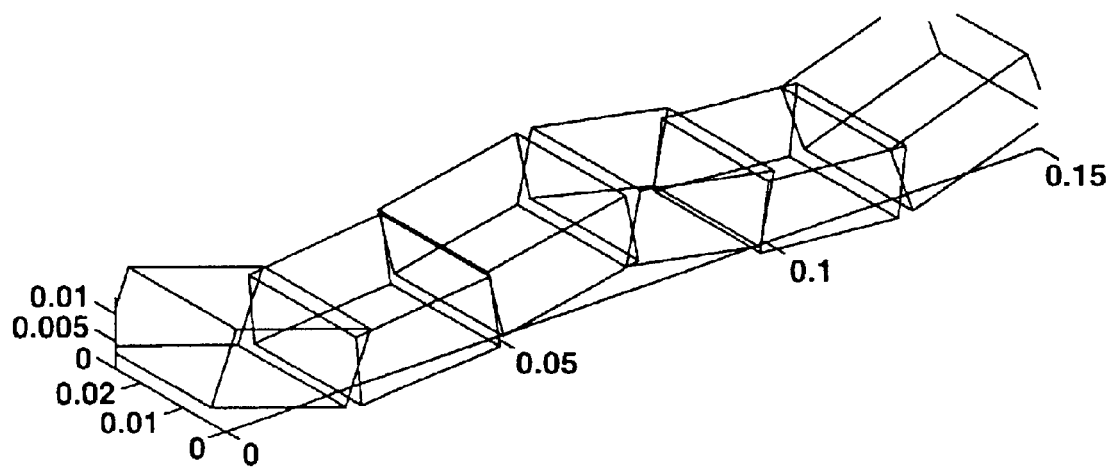

FIG. 7 illustrates an example in which the basic configuration shown in FIG. 1 is applied to a stage serving as the movable body 1. A stage 1 is supported by two springs 25a, 25b in the vertical direction for gravity compensation, and can perform rigid motion with two degrees of freedom, i.e., movement in the z direction and rotation around the y axis. The stage 1 has the structure of a beam that is long in the x direction, and has elastic-vibration modes as shown in FIGS. 13A–13C. Although the number of elastic-vibration modes of the beam is infinite, only three lower-order modes are shown in FIGS. 13A–13C. The stage 1 is driven in the z direction. At that time, elastic-vibration modes are inevitably excited.

In the system shown in FIG. 7, the z-direction position z of the center of gravity of the stage 1, and the angle of rotation $\Theta y$ around the y-axis direction at the center of gravity are controlled for each mode. It is assumed that the center of gravity of the stage 1 is just at the center of the stage 1. A central linear motor a (including a linear-motor stator 31a and a linear-motor rotor 32a) provided just below the position of the center of gravity of the stage 1, and two other side linear motors b, c (31b, 32b and 31c, 32c) provided at left and right positions, respectively, at the same distance L from the central linear motor a apply a driving force in the z direction to the stage 1.

In a system for controlling rigid-vibration modes of the stage 1, the two side motors b, c at both sides control rigid motion having two degrees of freedom, i.e., movement in the z direction, and rotation around the y axis. The central linear motor a is used when controlling elastic vibration. An amplifier 33 supplies the linear motors with electric power, and causes the linear motors a, b, c, to generate forces corresponding to instructed target forces using the linear-motor stators 31a–31c, and the linear-motor rotors 32a–32c.

Laser interferometers, for example, are used as rigid-vibration measuring means 7. By measuring the positions of two points in the z direction on the stage 1 by two laser interferometers, the z-direction position and the angle of rotation around the y axis at the center of gravity of the stage 1 when the stage 1 is assumed to be a rigid body can be measured. A rigid-body position 70 measured for each mode in the above-described manner can be represented by the following vector:

[Z $\Theta y$]', where ' represents a transposed matrix.

A position-instruction-value generation means 9 generates a target-position instruction value 90 for the z-direction position and the angle of rotation around the y axis at the center of gravity of the stage 1. The target-position instruction value 90 is represented by the following vector:

$$[Zr\ \Theta yr]'.$$

The difference between the target-position instruction value 90 and the measured rigid body position 70 is input to rigid-vibration control means 8, and a rigid-body driving-force instruction value for each mode for the stage 1 is generated. The rigid-body driving-force instruction value 80 for each mode is represented as follows:

$$[Fz\ Ty],$$

where Fz and Ty represent a translational force and a torque to be applied to the center of gravity in the rigid-body driving-force instruction value 80 for each mode, respectively.

When a transfer function of a compensating element within the rigid-vibration control means 8 is represented by G, the following relationship holds between the above-described vectors:

$$[Fz\ Ty]' = G^*([Zr\ \Theta yr]' - [Z\ \Theta y]'),$$

where G is a transfer function representing a PID (proportional integration and differential) controller.

It is necessary to generate these forces by two translational forces of the side linear motors b, c. These forces are instructed by the rigid-vibration driving-force instruction value 80, and are represented by the following vector:

$$[Fb1\ Fc1]'.$$

When the x-direction distance between the point of application of each of the side linear motors b, c and the position of the center of gravity is represented by L, the rigid-vibration driving-force instruction value 80 for the linear motors is calculated as follows:

$$[Fb1\ Fc1]' = Mi^*[Fz\ Ty]' \qquad \text{(Equation 1)},$$

where Mi is an inverse matrix of the following force matrix M:

$$M = \begin{bmatrix} \frac{1}{2} & \frac{1}{2} \\ \frac{1}{L} & \frac{-1}{L} \end{bmatrix}.$$

A piezoelectric element 51 bonded on the upper surface of the stage 1 generates a voltage proportional to elastic deformation of the stage 1. A measured value input to an amplifier 52 is input to elastic-vibration control means 6 as a measured elastic vibration 50. The measured elastic vibration 50 is represented by S. The elastic-vibration control means 6 obtains an elastic-vibration driving-force instruction value 60 for the stage 1 represented, for example, by the following (Equation 2) from the measured elastic vibration 50 proportional to the elastic deformation. The elastic-vibration driving-force instruction value 60 is represented by a vector at the left side of (Equation 2). By using the differential value of the measured elastic deformation (position information), control for improving the attenuation property of the elastic deformation is performed.

$$[Fa2\ Fb2\ Fc2]' = [-2\ 1\ 1]^* K1^* dS/dt \qquad \text{(Equation 2)},$$

where dS/dt represents the differential of S, and K1 represents an adjusting parameter for suppressing elastic vibration.

The sum of the rigid-vibration driving-force instruction value 80 and the elastic-vibration driving-force instruction value 60 represents forces [Fa Fb Fc]' to be generated by the linear motors:

$$[Fa\ Fb\ Fc]' = [0\ Fb1\ Fc1]' + [Fa1\ Fb2\ Fc2]'.$$

By configuring the system in the above-described manner, elastic vibration in the stage 1 is suppressed, so that a very precise system for controlling the position of the rigid body can be realized.

Second Embodiment

In the first embodiment, the method for suppressing elastic vibration by improving the attenuation property for elastic vibration using the differential value (velocity information) of the measured value (position information) of elastic-vibration measuring means 5 has been shown. By also feeding back position information relating to elastic vibration, the rigidity of an elastic body can be improved. In the first embodiment, only the value dS/dt, i.e., the differential of the elastic-vibration measured value S is fed back. In a second embodiment of the present invention, however, a control system is configured by replacing (Equation 2) by the following (Equation 3):

$$[Fa2\ Fb2\ Fc2]' = [-2\ 1\ 1]^* (K2^*S + K1^* dS/dt) \qquad \text{(Equation 3)},$$

where K2 is a parameter for setting rigidity.

According to such a configuration, since the resonance frequency of elastic vibration can be increased and the attenuation property at a resonance point can be arbitrarily controlled, it is possible to increase the control band of a rigid-body control system. As a result, it is possible to improve the control performance of the rigid-body control system.

Third Embodiment

Usually, in a state in which gravity is exerted, in order to support the weight of a movable body, it is necessary to support the movable body using springs in the first and second embodiments, springs 25a, 25b are provided below the stage 1. If the rigidity of the springs supporting the stage is high, elastic vibration is influenced by the springs 25a, 25b, sometimes resulting in difficulty of correction of elastic vibration. Accordingly, by making the rigidity of the springs for correcting gravity as small as possible, it is possible to easily realize a system having a high elastic-vibration suppressing property.

Fourth Embodiment

Figure 15A:
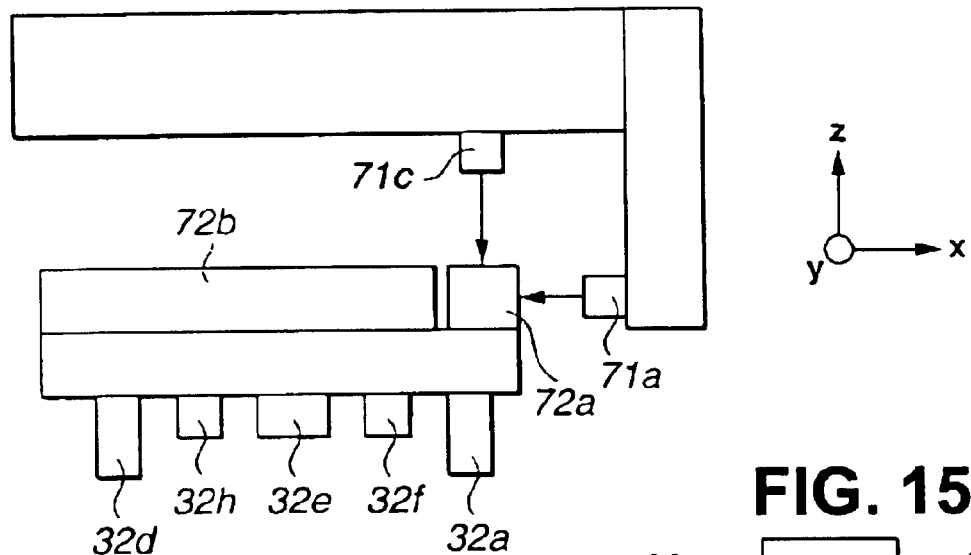
FIGS. 15A, 15B and 15C are diagrams illustrating the configuration of a fourth embodiment of the present invention.
Figure 15B:
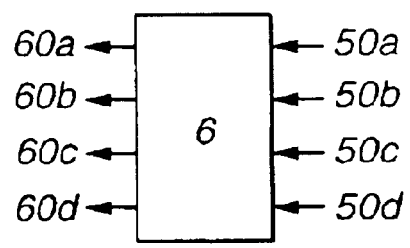
Figure 15C:
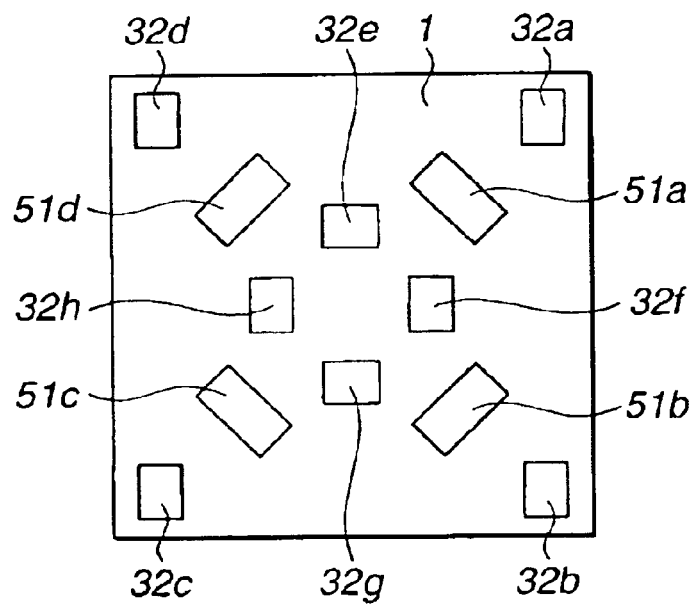

In the first and second embodiments, a stage having the shape of a beam is assumed. Since the beam has simple lower-order elastic vibration modes, control of elastic vibration is relatively easy. FIGS. 15A–15C illustrate a flat stage having a substantially square shape, according to a fourth embodiment of the present invention. In this case, elastic-vibration modes are as shown in FIGS. 14A–14D. First-order elastic vibration in such a case can be suppressed by providing means for applying force to four corners of the quadrangle. The fourth embodiment illustrates a case in which a very precise rigid-vibration control system is provided by controlling six degrees of freedom of rigid vibration of the flat stage as well as elastic vibration of the flat stage. In the following description, positions (x, y, z) in translational three-axes directions with respect to a reference coordinate system and angles of rotation ($\theta x$, $\theta y$, $\theta z$) around translational three axes are called the positions of six degrees of freedom.

As shown in FIG. 15C, linear motors 32a–32d for generating a force in the z direction (a direction perpendicular to the plane of FIG. 15B) are disposed at four corners of the flat plate, as driving means 3. In order to control rigid vibration modes in horizontal directions, four linear motors 32e–32h for generating forces in horizontal directions (x and y directions) are also disposed. A mirror 72 and laser interferometers 71 are provided on the flat plate and a surface plate 48, serving as a reference position, respectively, as flat-plate rigid-vibration measuring means 7. Although not illustrated in FIGS. 15A–15C, in order to measure the positions of six degrees of freedom of the flat plate, six laser interferometers are provided at the minimum. According to measured values of the laser interferometers, the following rigid-body positions 70 of six degrees of freedom of a rigid body are measured:

[XYZ Θx Θy Θz]'.

By changing the degrees of freedom to be controlled from two, i.e., [Z Θy]' in the first embodiment, to the above-described six, a control system is configured according to the same procedure. Input/output values for respective elements and a calculation equation will now be described. A target-position instruction value 90 generated by position-instruction-value generation means 9 is represented by the following vector:

[Xr Yr Zr Θxr Θyr Θzr]'.

The rigid-vibration driving-force instruction value 80 for each mode is represented by:

[Fx Fy Fz Tx Ty Tz]'.

When the transfer function of a compensating element within rigid-vibration control means 8 is represented by G2, the following relationship holds among the above-described vectors:

[Fx Fy Fz Tx Ty Tz]'=G2*([Xr Yr Zr Θxr Θyr Θzr]'−[XYZ Θx Θy Θz]'.

A rigid-vibration driving-force instruction value 80 indicating a driving force to be generated from each linear motor is calculated as follows from the above-described rigid-vibration driving-force instruction value 80 for each mode, using the position of the center of gravity of the flat plate, the arrangement of the linear motors, the direction of action of the force, and an inverse matrix Mi2 of a force matrix M2 obtained by taking into consideration restriction conditions:

[Fa1 Fb1 Fc1 Fd1 Fe1 Ff1 Fg1 Fh1]=Mi2*[Fx Fy Fz Tx Ty Tz 0 0]'.

In order to control elastic vibration of the flat plate, four piezoelectric elements 51a–51d for measuring elastic deformation in the diagonal direction of the flat plate are obliquely arranged. Measured elastic vibrations 50 of four sets of elastic deformation measured by the piezoelectric elements 51a–51d are represented by the following vector:

[Sa Sb Sc Sd]'.

The property of attenuation of elastic vibration is improved by feeding back the velocity component of elastic deformation. The velocity component of elastic vibration is represented as follows by differentiating the deformation (position) component of elastic vibration:

$$\frac{d}{dt}[Sa\ Sb\ Sc\ Sd]'$$

In order to control elastic vibration, an elastic vibration driving-force instruction value 60 to be provided to the four linear motors is obtained as follows:

$$[Fa2\ Fb2\ Fc2\ Fd2]' = N * \frac{d}{dt}[Sa\ Sb\ Sc\ Sd]'$$

$$N = \begin{bmatrix} K3 & 0 & K3 & 0 \\ K4 & 0 & K4 & 0 \\ 0 & K3 & 0 & K3 \\ 0 & K4 & 0 & K4 \end{bmatrix}.$$

where K3 and K4 are parameters for adjusting the attenuation factor of elastic vibration.

A force vector to be finally generated by the linear motors is obtained as the sum of the rigid-body driving-force instruction value 80 and the elastic-vibration driving-force instruction value 60:

[Fa Fb Fc Fd Fe Ff Fg Fh]=[Fa1 Fb1 Fc1 Fd1 Fe1 Ff1 Fg1 Fh1]+[Fa2 Fb2 Fc2 Fd2 0000].

Fifth Embodiment

Figure 8:
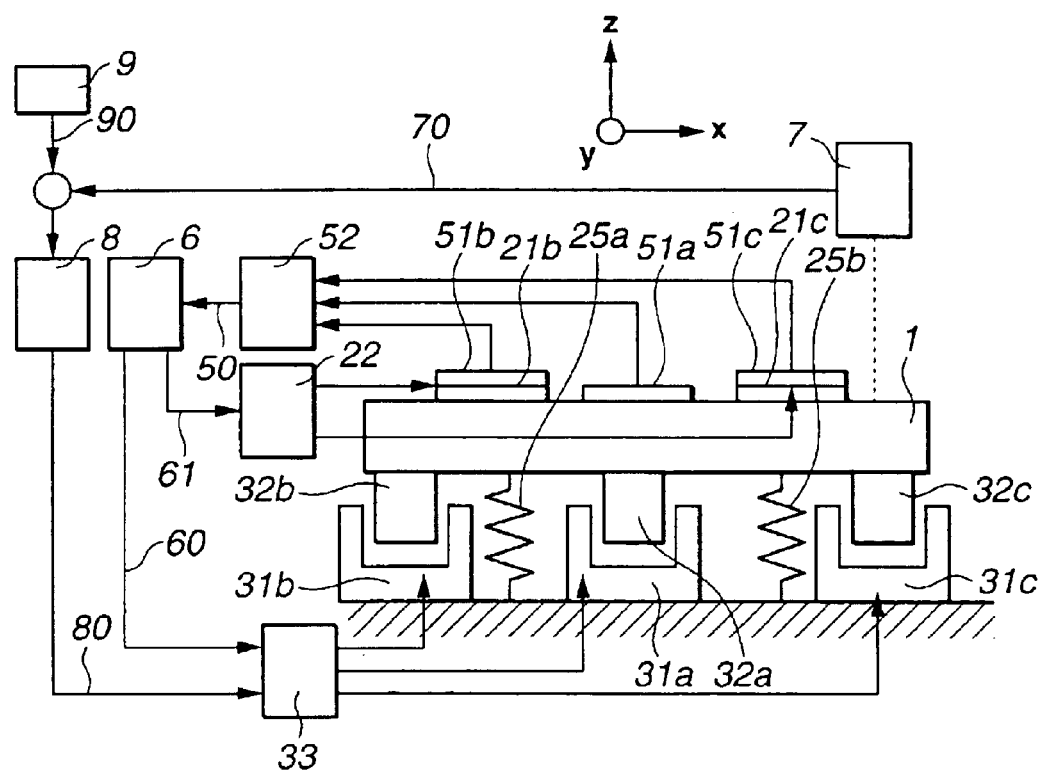
FIG. 8 is a diagram illustrating the configuration of a fifth embodiment of the present invention.

FIG. 2 is a diagram illustrating a second basic configuration. FIG. 8 illustrates the configuration of a fifth embodiment of the present invention in which the configuration shown in FIG. 2 is applied to the stage shown in FIG. 7. In FIG. 8, the configuration of a loop of rigid vibration control is the same as that shown in FIG. 7 (the first embodiment). The configuration of measuring elastic vibration utilizing elastic-vibration measuring means 5 and generating an elastic-vibration driving-force instruction value 60 is substantially the same as that shown in FIG. 7. The fifth embodiment differs from the first embodiment in that elastic-vibration driving means 2 is added, and a loop for suppressing elastic vibration by feeding back a measured value of the elastic-vibration measuring means 5 to the elastic-vibration driving means 2 is added.

In FIG. 8, three piezoelectric elements 51a, 51b, 51c, serving as the elastic-vibration measuring means 5, and two piezoelectric elements 21b, 21c, serving as the elastic-vibration driving means 2, are bonded on the upper surface of the stage 1 shown in FIG. 7. These elements are connected as shown in FIG. 8, and velocity components of elastic vibration measured by the piezoelectric elements 51a, 51b, 51c are fed back to the piezoelectric elements 21b, 21c for driving with an appropriate gain. According to such a configuration, suppression of vibration for second-order and third-order elastic-vibration modes shown in FIGS. 13A–13C can be performed, to realize more precise stage-position control system.

Measured elastic vibrations 50 detected by the piezoelectric elements 51a, 51b, 51c are represented by the following vector:

[Sa Sb Sc]'

The piezoelectric elements 51b, 51c provided at both sides of the stage 1 measure second-order and third-order elastic vibrations of the stage 1. An elastic-vibration driving-force second instruction value 61 is obtained as follows using the measured values:

$$[Tb\ Tc]' = K5 * \frac{d}{dt}[Sb\ Sc]', \quad \text{(Equation 4)}$$

where K5 is a gain for adjusting the characteristics of an elastic-vibration feedback system.

The above-described elastic-vibration driving-force second instruction value 61 is instructed to the piezoelectric elements 21b, 21c, serving as the elastic-vibration driving means 2. The elastic-vibration driving-force instruction value 60 is obtained as follows:

$$[Fa3\ Fb3\ Fc3]' = \quad \text{(Equation 5)}$$
$$K6 * [-2\ 1\ 1] * [1\ 1\ 1] * \frac{d}{dt}[Sa\ Sb\ Sc]'$$

The sum of this value and a driving-force instruction value 80 [Fb1 Fc1]' for rigid-vibration control obtained in the same manner as in the first embodiment is input to the linear motors as a force instruction value:

$$[Fa\ Fb\ Fc]' = [0\ Fb1\ Fc1]' + [Fa3\ Fb3\ Fc3]'.$$

Sixth Embodiment

Figure 9:
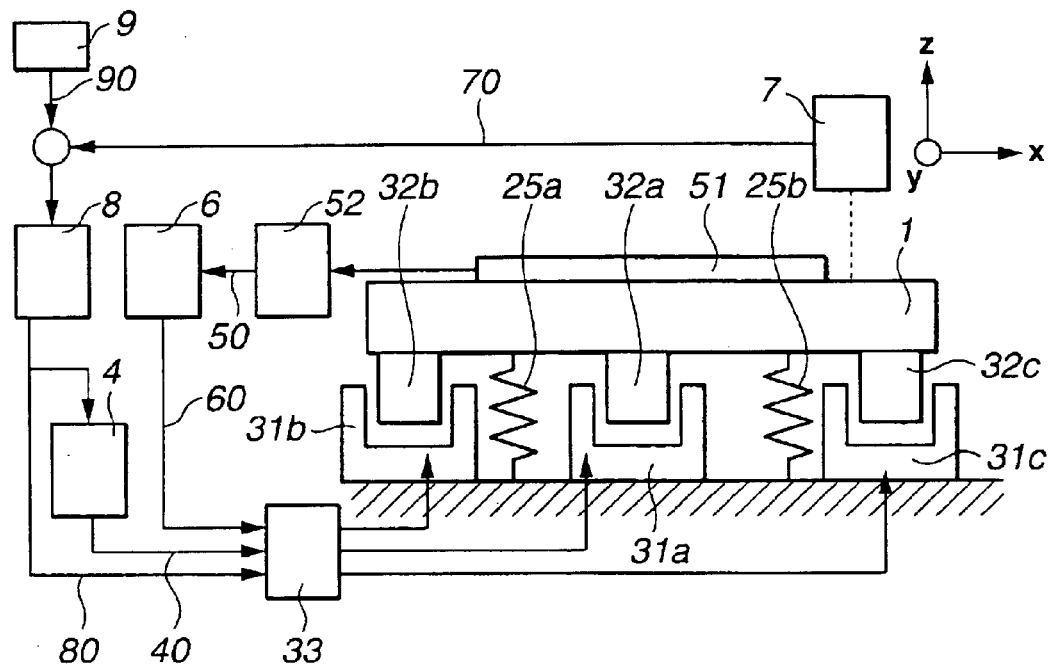
FIG. 9 is a diagram illustrating the configuration of a sixth embodiment of the present invention.

FIG. 3 is a diagram illustrating a third basic configuration. FIG. 9 is a diagram illustrating a configuration when the configuration of FIG. 3 is applied to the stage system shown in FIG. 7. As already described, FIG. 3 illustrates the configuration in which the elastic-vibration feedback control system and the elastic-vibration feedforward control system are combined.

The configuration shown in FIG. 9 differs from the configuration shown in FIG. 7 (the first embodiment) in that elastic-vibration compensation means 4 is further added, and a driving-force instruction value 40 is output to driving means 3, which uses a rigid-vibration driving-force instruction value 80. The rigid-vibration driving-force instruction value 80 is the value obtained in the first embodiment, and is expressed by Equation 1. The elastic-vibration compensation means 4 obtains the driving-force instruction value 40 as follows:

$$[Fa4\ Fb4\ Fc4]' = K7 * [-211]' * [11] * [Fb1\ Fc1]' \quad \text{(Equation 6)}.$$

A value obtained by adding the above-described driving-force instruction value 40 to Equation 1 and Equation 2 obtained in the first embodiment is input to the linear motors, a, b, c as a force instruction value:

$$[Fa\ Fb\ Fc]' = [0\ Fb1\ Fc1]' + (Fa2\ Fb2\ Fc2)' + [Fa4\ Fb4\ Fc4]' \quad \text{(Equation 7)}.$$

By adding this loop to the system of the first embodiment, generation of elastic vibration due to the rigid-vibration driving-force instruction value 80 can be suppressed. Accordingly, it is possible to realize a position control system having an excellent elastic-vibration suppression property.

Seventh Embodiment

Figure 10:
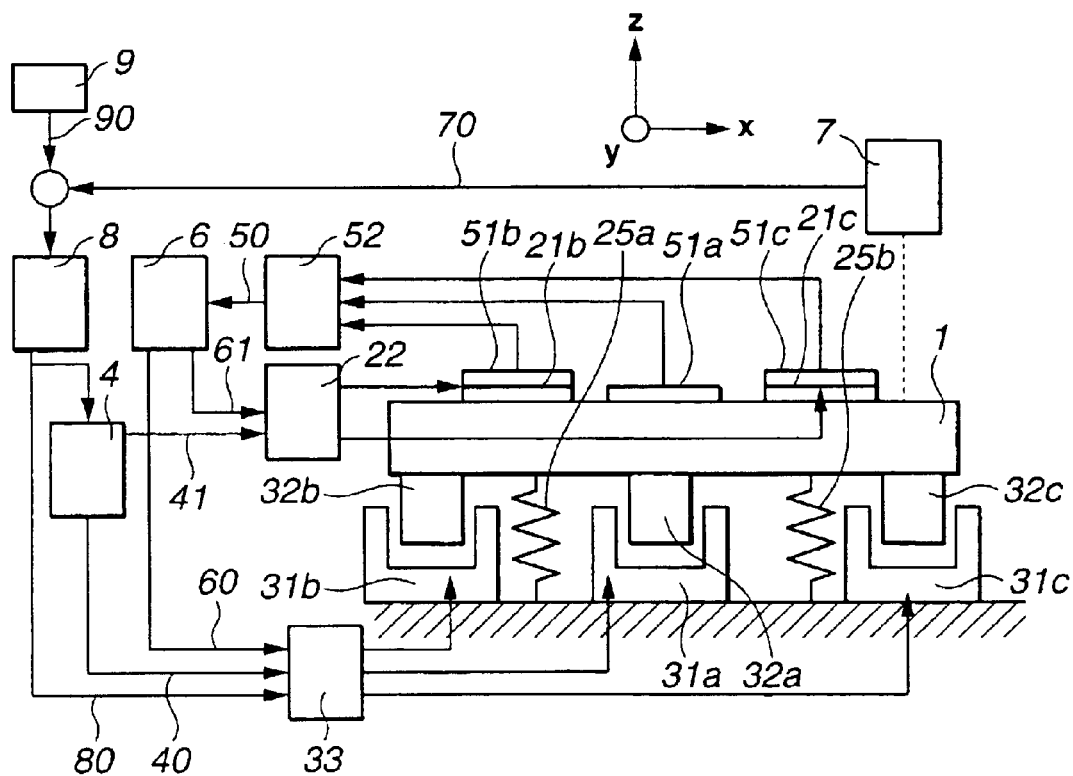
FIG. 10 is a diagram illustrating the configuration of a seventh embodiment of the present invention.

FIG. 4 is a diagram illustrating a fourth basic configuration. FIG. 10 is a diagram illustrating a configuration when the configuration shown in FIG. 4 is applied to the stage system shown in FIG. 7.

The configuration shown in FIG. 10 differs from the configuration shown in FIG. 8 (the fifth embodiment) in that elastic-vibration compensation means 4 is further added, and a driving-force instruction value 40 and a driving-force instruction value 41 are output to driving means 3 and to elastic-vibration driving means 2, respectively, using a rigid-vibration driving-force instruction value 80. The rigid-vibration driving-force instruction value 80 is the value obtained in the first embodiment, and is expressed by Equation 1. The elastic-vibration compensation means 4 obtains the driving-force instruction value 40 and the driving-force instruction value 41 in the following manner. The driving-force instruction value 40 is expressed by Equation 6 obtained in the sixth embodiment, and the driving-force instruction value 41 is obtained, for example, as follows:

$$[Tb2\ Tc2]' = K8 * [11] * [Fb1\ Fc1] * [1/2\ 1/2]' \quad \text{(Equation 8)}.$$

The sum of the value of Equation 4 in the fifth embodiment and the value of the above-described Equation 8 is provided as an instruction value to elastic-vibration driving means 2.

By adding this loop to the system of the fifth embodiment, generation of elastic vibration due to the rigid-vibration driving-force instruction value 80 can be suppressed. Accordingly, it is possible to realize a position control system having an excellent elastic-vibration suppression property. The system of the seventh embodiment differs from the system of the sixth embodiment in that even higher-order elastic vibration that cannot be suppressed in the system of the sixth embodiment can also be suppressed.

Eighth Embodiment

Figure 11:
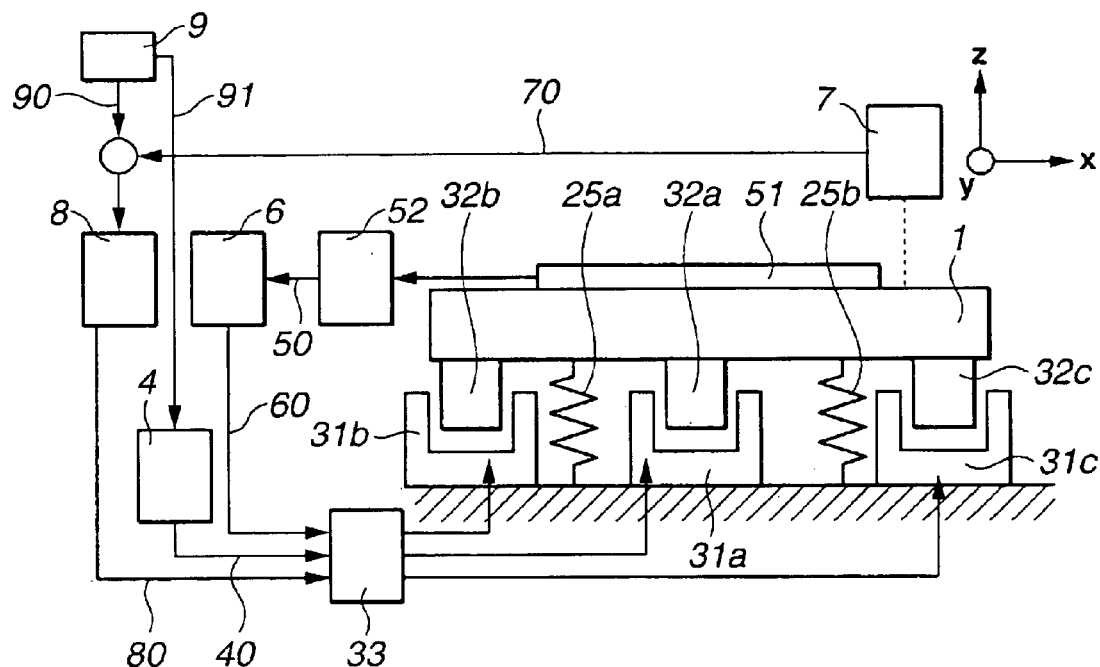
FIG. 11 is a diagram illustrating the configuration of an eighth embodiment of the present invention.

FIG. 5 is a diagram illustrating a fifth basic configuration. FIG. 11 is a diagram illustrating a configuration when the configuration shown in FIG. 5 is applied to the stage system shown in FIG. 7.

In the sixth embodiment (FIGS. 3 and 9), the elastic-vibration compensator 4 estimates elastic vibration generated in the movable body using the rigid-vibration driving-force instruction value 80 output from the rigid-vibration control means 8, and obtains the driving-force instruction value 40 for suppressing the elastic vibration. In an eighth embodiment of the present invention, however, instead of using the rigid-vibration driving-force instruction value 80, a driving external force is estimated from a target-acceleration instruction value 91, and is used for control. This is because, as already described, when using the rigid-vibration driving-force instruction value 80, the open-loop transfer function of the system tends to degrade stability, thereby sometimes making the system unstable. When using the target-acceleration instruction value 91 instead of the rigid-vibration driving-force instruction value 80, since the open-loop transfer function of the system does not change, it is possible to estimate elastic vibration and suppress the elastic vibration without degrading stability.

The driving-force instruction value 40 obtained in the sixth embodiment can be obtained in this system according to the following Equation 9:

$$[Fa4\ Fb4\ Fc4]' = Ky * [-211] * [11] * Mi * m * [Az\ Aty]' \quad \text{(Equation 9)},$$

where [Az Aty] represents the target-acceleration instruction value 91 in the z direction and the direction of rotation around the y axis of rigid vibration, Mi represents the matrix defined by Equation 1, and m is the mass of the movable body 1.

The system can be configured by calculating Equation 7 in the sixth embodiment using Equation 9 instead of Equation 6.

Ninth Embodiment

Figure 12:
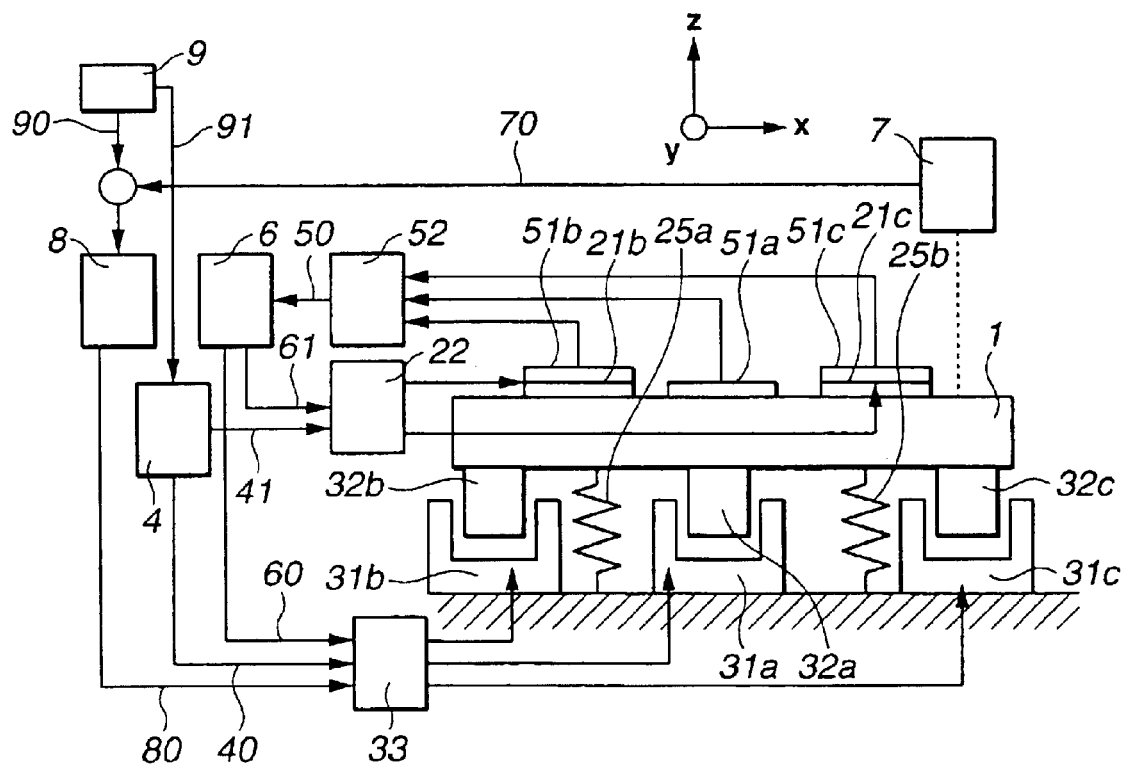
FIG. 12 is a diagram illustrating the configuration of a ninth embodiment of the present invention.

FIG. 6 is a diagram illustrating a sixth basic configuration. FIG. 12 is a diagram illustrating a configuration when the configuration shown in FIG. 6 is applied to the stage system shown in FIG. 7.

In the seventh embodiment (FIGS. 4 and 10), the elastic-vibration compensator 4 estimates elastic vibration generated in the movable body using the rigid-vibration driving-force instruction value 80 output from the rigid-vibration control means 8, and obtains the driving-force instruction value 40 and the driving-force instruction value 41 for suppressing the elastic vibration. In a ninth embodiment of the present invention, however, as in the eight embodiment, instead of using the rigid-vibration driving-force instruction value 80, a driving external force is estimated from a target-acceleration instruction value 91, and the above-described values are obtained.

The driving-force instruction value 40 is obtained using Equation 9. The driving-force instruction value 41 is obtained in the following manner, instead of using Equation 8 in the seventh embodiment:

$$[Ta2 \ Tb2]' = K8 * Mi * m * [Az \ Aty]' \quad \text{(Equation 10)},$$

where constants and variables other than K8 are the same as in Equation 9, and K8 is a parameter for adjusting the effect of feedforward. Calculation of other instruction values is the same as in the seventh embodiment. The ninth embodiment differs from the eighth embodiment in that even higher-order elastic vibration that cannot be suppressed in the system of the eighth embodiment can also be suppressed.

Tenth Embodiment

Figure 16A:
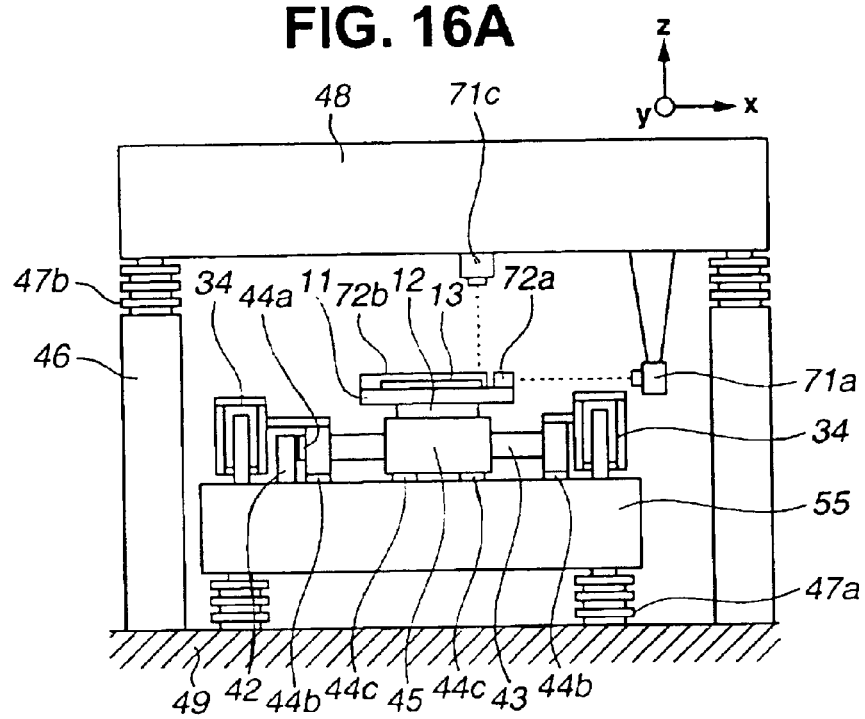
FIGS. 16A–16D are diagrams illustrating the configuration of a tenth embodiment of the present invention.
Figure 16B:
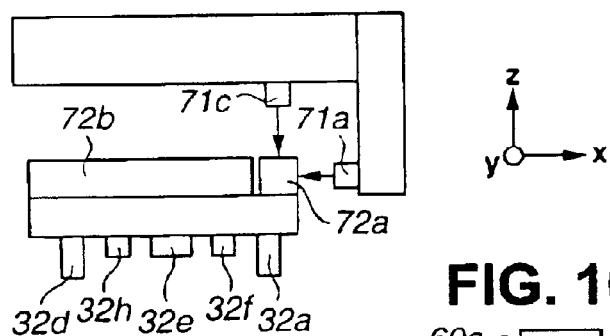
Figure 16C:
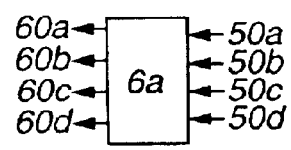
Figure 16D:
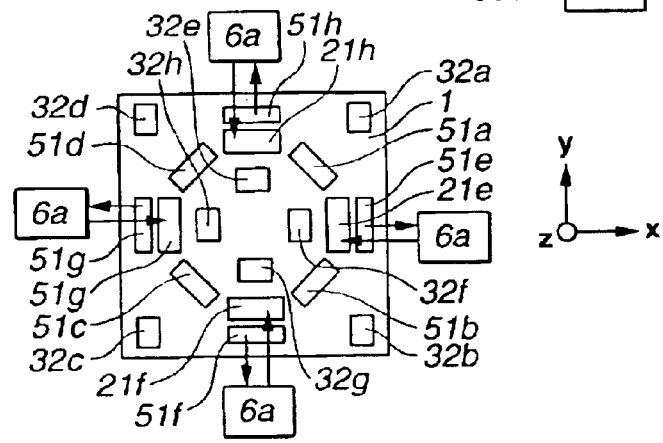

In a tenth embodiment of the present invention, the second basic configuration (FIG. 2) is applied to a wafer stage of an exposure apparatus (a semiconductor exposure apparatus in this case) for manufacturing micro-devices, such as semiconductor devices or the like. FIG. 16A is a schematic diagram illustrating the configuration of a semiconductor exposure apparatus. FIGS. 16B–16D illustrates the details of a tilt stage. The tilt stage of the tenth embodiment has substantially the same configuration as the flat stage described in the fourth embodiment.

In FIG. 16A, a wafer-stage surface plate 55 is supported via dumpers 47a from a floor 49. A Y stage 43 is movable in the y direction on the reference surface of the wafer-stage surface plate 55 by a Y linear motor 34 for generating a thrust in the y direction along a fixed guide 42 fixed on the wafer-stage surface plate 55. The wafer-stage surface plate 55, the fixed guide 42 and the Y stage 43 are connected through air via air pads 44a and 44b, each serving as a hydrostatic bearing, in a non-contact state. The Y stage 43 has an x-direction guide, and guides an X stage 45 mounted on the Y stage 43 in the x direction. An X-linear-motor stator for generating a force in the x direction is provided on the Y stage 43, in order to drive the X stage 45 in the x direction in coorporation with an X-linear-motor rotor provided on the X stage 45. A surface plate 41, the X guide and the X stage 45 are connected through air via an air pad 44c, serving as a hydrostatic bearing, in a non-contact state.

A tilt stage 12 is mounted on the X stage 45. In the tenth embodiment, the entirety including a stage substrate (top plate), a mirror for a laser interferometer, a linear motor for fine movement, and the like is termed the tilt stage 12. The tilt stage 12 includes a stage substrate 11 having a wafer chuck for holding a wafer 13, serving as an object to be exposed. Measurement mirrors 72a, 72b, which are used for position measurement in six-axes directions using a barrel surface plate 48 of the stage as a reference, are provided on the stage substrate 11. The barrel surface plate 48 is supported by struts 46 via dumpers 47b. Laser interferometers 71 are provided at the barrel surface plate 48 side. Although in FIG. 14A, only two laser interferometers 71a, 71c for measuring x-direction and z-direction positions of the tilt stage 12 are shown, six laser interferometers at the minimum are provided in order to measure six-axes rigid-body positions of the tilt stage 12. Although not illustrated, laser interferometers are separately provided in order to measure the positions of the X stage 45 and the Y stage 43. In the tenth embodiment, the tilt stage 12 is a six-axes fine-movement stage. The X stage 45 and the Y stage 43 operate as coarse-movement stages. That is, the X stage 45 and the Y stage 43 are designed so as to move with a large stroke although accuracy is not high. The tilt stage 12 can perform a very precise operation although the movable stroke is small.

FIGS. 16B–16D illustrates the details of the tilt stage 12. FIGS. 16B and 16C represent the side and the back, respectively, of the tilt stage 12. Linear motors 32a–32h drive the tilt stage 12. Each of the linear motors 32e–32h generates a force in a horizontal direction, and each of the linear motors 32a–32d generates a force in a vertical direction. The tilt stage 12 performs movement in horizontal three-axes (x, y, and z) directions and rotation around three axes (θx, θy, θz) by the thrusts of the linear motors 32a–32h, in order to control six-axes rigid vibration. Piezoelectric elements 21e–21h are disposed as elastic-vibration driving means 2 for generating forces to bend the stage substrate 11. Piezoelectric elements 51e–51h are disposed at portions adjacent to the piezoelectric elements 21e–21h, respectively, as elastic-vibration measuring means 5 for measuring bending distortion. Piezoelectric elements 51a–51d are also disposed as elastic-vibration measuring means 5 for controlling elastic vibration in the diagonal direction.

Positioning of the X stage 45, positioning of the Y stage 43, and positioning of the tilt stage 12 in six-axes directions are achieved by providing a servo system at each axis. Control (calculation) means (not shown) calculates driving instruction values for an x-direction linear motor and a y-direction linear motor, serving as actuators for the tilt stage 12 in the x direction and the y direction, respectively, based on position information from the laser interferometers 71, and drives each of the X stage 45 and the Y stage 43. In the tilt stage 12, in order to control the position of the rigid body in six-axes directions, a position control system is separately provided. The position control system of the tilt stage 12 is substantially the same as in the fourth embodiment. Although the configuration of FIG. 1 is used in the fourth embodiment, the configuration of FIG. 2 is used in the tenth embodiment. In the configuration shown in FIG. 2, elastic-vibration driving means 2 is added to the configuration shown in FIG. 1, in order to also suppress higher-order elastic vibration that cannot be suppressed in the configuration shown in FIG. 1. In the tenth embodiment, linear motors 32a–32h are used for suppressing elastic vibration in the diagonal direction of the flat plate, and piezoelectric elements are used for suppressing elastic vibration in the directions of sides of the flat plate as driving elements.

A stage position-instruction-value generation means 9 generates a target-position instruction 90 for six axes of the tilt stage 12. The x and y components of the instruction value are also used as instruction values for the X stage 45 and the Y stage 43, respectively. Rigid-vibration control means 8 determines rigid-vibration driving-force instruction values 80 for the linear motors 32a–32h, serving as rigid-vibration driving means 3, from the target-position instruction value 90 and tilt-stage six-axes measurement signals 70a–70f measured by the laser interferometers 71. Elastic-vibration control means 6 improves the attenuation property of elastic vibration of the top plate by feeding back the velocity component of elastic vibration, as described in the fourth embodiment. The elastic-vibration control means 6 includes elastic-vibration control means 6a operating in the same manner as the elastic-vibration control means 6 of the fourth embodiment, and elastic-vibration control means 6e–6h (not shown) for controlling elastic vibration in the directions of sides of the flat plate. The elastic-vibration control means 6e–6h detects elastic deformation using the piezoelectric elements 51e–51h, respectively, differentiates measured values and multiplies the obtained values by an appropriate gain, and supplies the piezoelectric elements 21e–21h with the resultant values.

Since elastic vibration occurring during driving of the tilt stage 12 can be effectively suppressed according to the effects of the above-described elements for controlling elastic vibration, the position control system for controlling rigid vibration of the tilt stage 12 can increase the upper limit of a servo band, and thereby improve accuracy in position control of the tilt stage 12.

The methods of references 3 and 4 are methods for suppressing vibration by a feedback system. It is known in the field of control that feedforward control is effective for improving the response property. In the following description, it is intended to realize prompt suppression of elastic vibration using feedforward control.

When the magnitude and the direction of an external force for moving a movable body, the point of application of the external force to the movable body, the shape and the material of the movable body, and the like are known in advance, an internal force for suppressing elastic deformation of the movable body is determined based on such information and is generated by internal-force generation means. It is thereby possible to suppress elastic vibration of the movable body.

Figure 17:
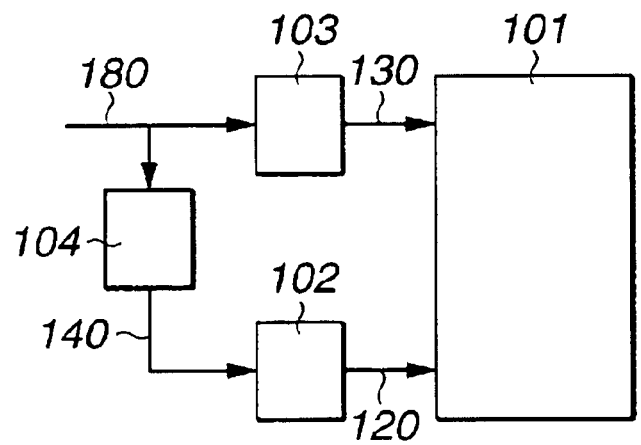
FIG. 17 is a diagram illustrating a seventh basic configuration.

In order to suppress elastic vibration of the movable body, a configuration shown in FIG. 17 is proposed as a seventh basic configuration. Elastic-vibration driving means 102 for generating an internal force is mounted on a movable body 101. The magnitude of a force to be generated by the elastic-vibration driving means 102 is calculated from a driving instruction value for rigid-body driving means for generating an external force to move the movable body.

According to such a configuration, it is possible to perform feedfoward control in which, when an external force is applied, deformation by the external force is instantaneously suppressed. By providing such a system having a high response property, it is possible to minimize elastic deformation by an external force applied to a movable body. As a result, elastic vibration caused by elastic deformation can be greatly suppressed. By providing a position control system outside of such a configuration for suppressing elastic vibration (a control loop), it is also possible to provide a very high speed and very precise position control system.

Eleventh Embodiment

Figure 23:
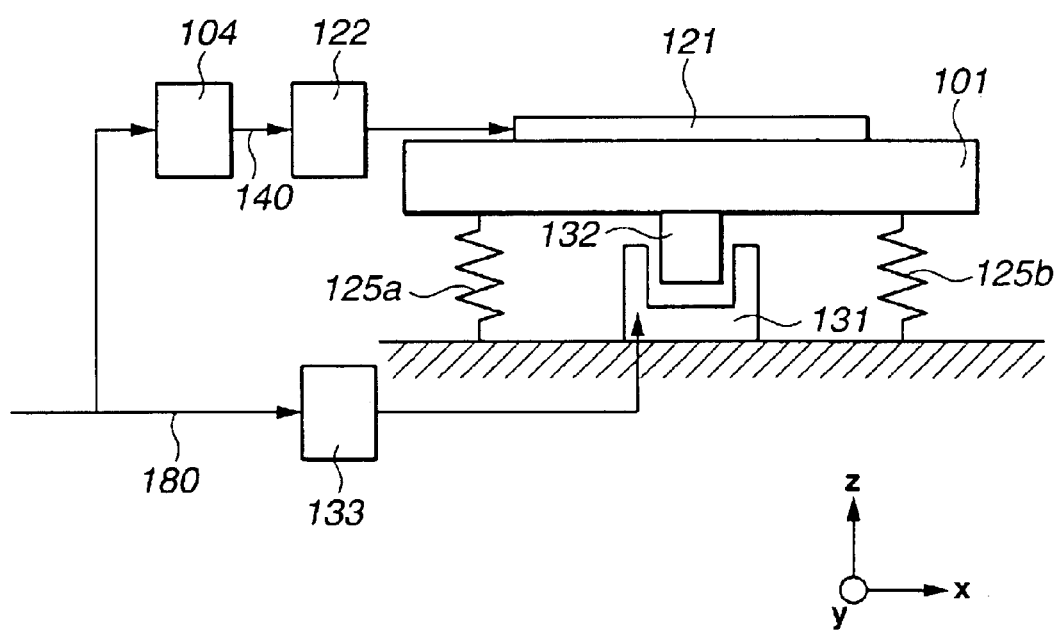
FIG. 23 is a diagram illustrating the configuration of an eleventh embodiment of the present invention.
Figure 24A:
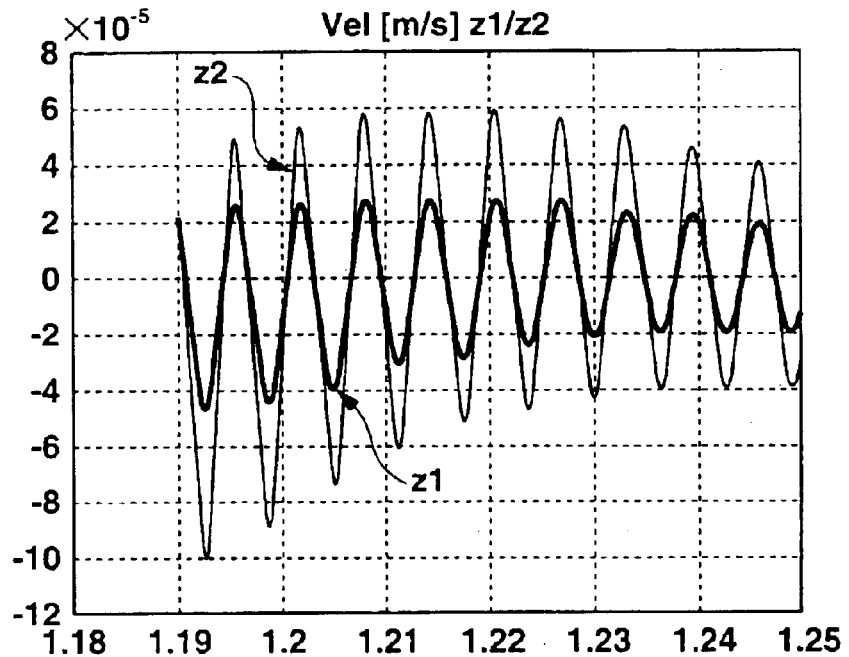
FIGS. 24A and 24B are graphs, each illustrating an effect of suppressing elastic vibration in the configuration of the eleventh embodiment.
Figure 24B:
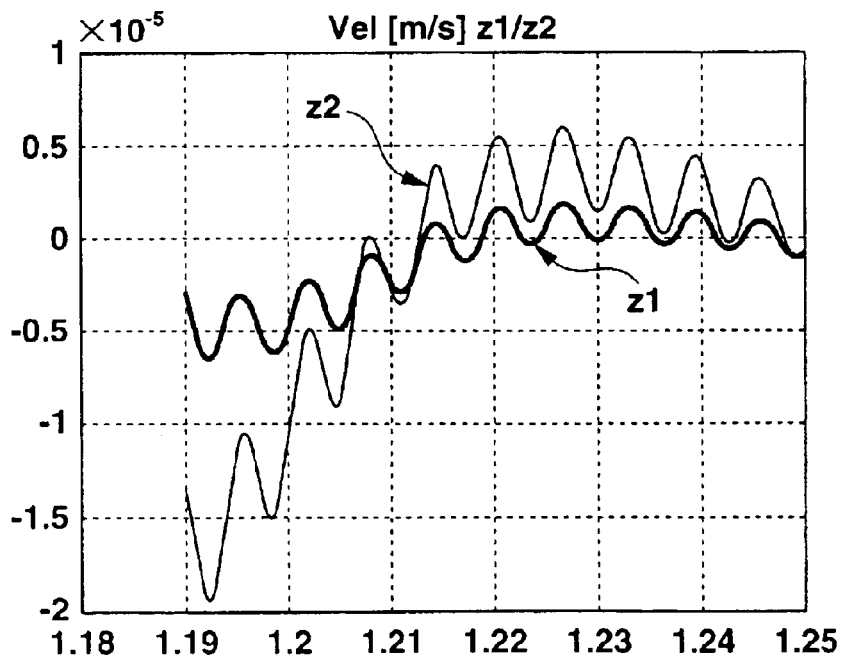

FIG. 23 illustrates a specific example of the first basic configuration (shown in FIG. 1) according to an eleventh embodiment of the present invention. In FIG. 23, a movable body 101 is a stage. The stage 101 has the structure of a beam that is long in the x direction. A linear motor, serving as rigid-body driving means 103, disposed below the center of the stage 101 includes a rotor 132 and a stator 131. An amplifier 133 for supplying the linear motor with electric power is connected to the linear motor, to generate a force in the z direction. Springs 125a and 125b for supporting the weight of the stage 101 in the vertical direction (z direction) are provided at left and right sides below the stage 101. A piezoelectric element 121 for suppressing elastic vibration is bonded on the upper surface of the stage 101. An amplifier 122 for supplying the piezoelectric element 121 with electric power is connected to the piezoelectric element 121. The piezoelectric element 121 and the amplifier 122 correspond to the elastic-vibration driving means 102 shown in FIG. 17. In such a system, when a driving instruction value 180 is provided to the linear motor, the linear motor generates an external force 130 to move the stage 101 in the z direction. As a result, the stage 101 moves in the z direction and generates elastic vibration mainly in the vertical direction. FIG. 24A illustrates vibration in the z direction at left and right ends of the stage 101 when feedforward compensation is not performed, for example, by disconnecting a driving instruction value 140 in the configuration shown in FIG. 23. In FIG. 24A, z1 and z2 represent speeds at the left end and the right end of the stage 101, respectively. FIG. 24B illustrates vibration at the same positions when feedforward compensation is performed. Comparison between FIGS. 24A and 24B indicates that the magnitude of vibration decreases to substantially 1/20 by forward compensation. As described above, according to the configuration of the eleventh embodiment, movement of the stage can be performed while minimizing elastic vibration.

Twelfth Embodiment

Figure 18:
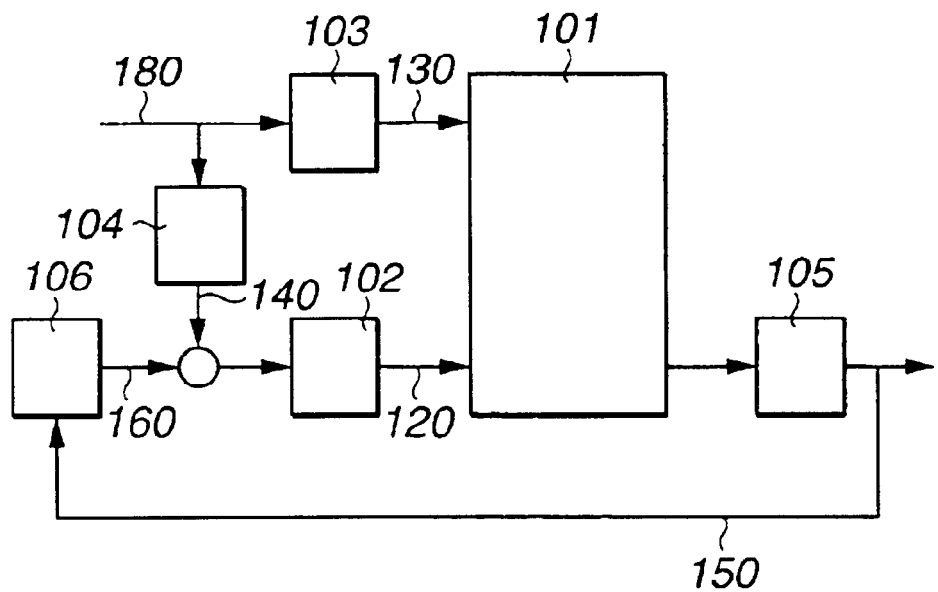
FIG. 18 is a diagram illustrating an eighth basic configuration.

Although the configuration shown in FIG. 17 of the eleventh embodiment can suppress elastic vibration generated by the driving instruction value 180 for the movable body, elastic vibration when a force is applied to the movable body due to other disturbances cannot be suppressed. In such a case, a basic configuration shown in FIG. 18 is effective. Elastic vibration can be suppressed by measuring the elastic vibration with elastic-vibration measuring means 105 shown in FIG. 18, and applying an internal force 120 to the movable-body using elastic-vibration driving means 102 via elastic-vibration control means 106.

Figure 25:
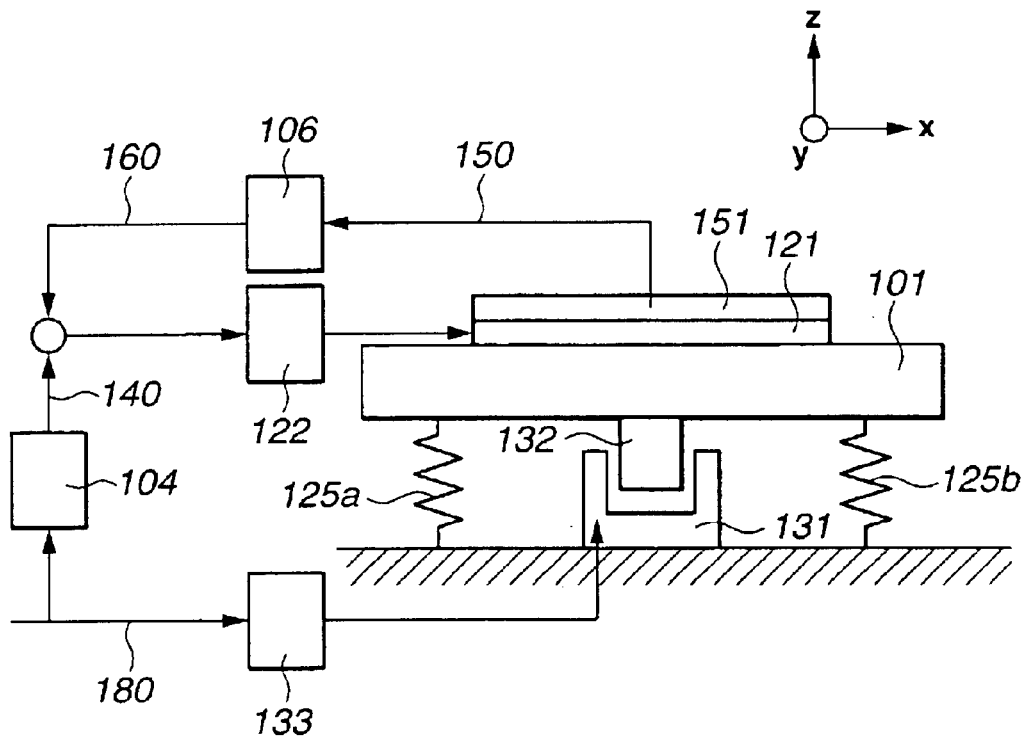
FIG. 25 is a diagram illustrating the configuration of a twelfth embodiment of the present invention.

FIG. 25 illustrates a specific example of the basic configuration shown in FIG. 18. In FIG. 25, a piezoelectric element 151, serving as elastic-vibration measuring means 105, is bonded over a piezoelectric element 121, serving as the elastic-vibration driving means 102, on the stage. A measured elastic vibration 150 of the elastic-vibration measuring means 105 is fed back to the elastic-vibration control means 106, and the sum of an elastic-vibration driving instruction value 160 derived by the elastic-vibration control means 106 and an output value 140 derived by an elastic-vibration compensator 104 is supplied to an amplifier 122 for transmission to the piezoelectric element 121, serving as the elastic-vibration driving means 102. According to such a configuration, elastic vibration can be suppressed for both of an external force when the stage is driven by a linear motor and an external force applied due to other disturbance.

Thirteenth Embodiment

Figure 19:
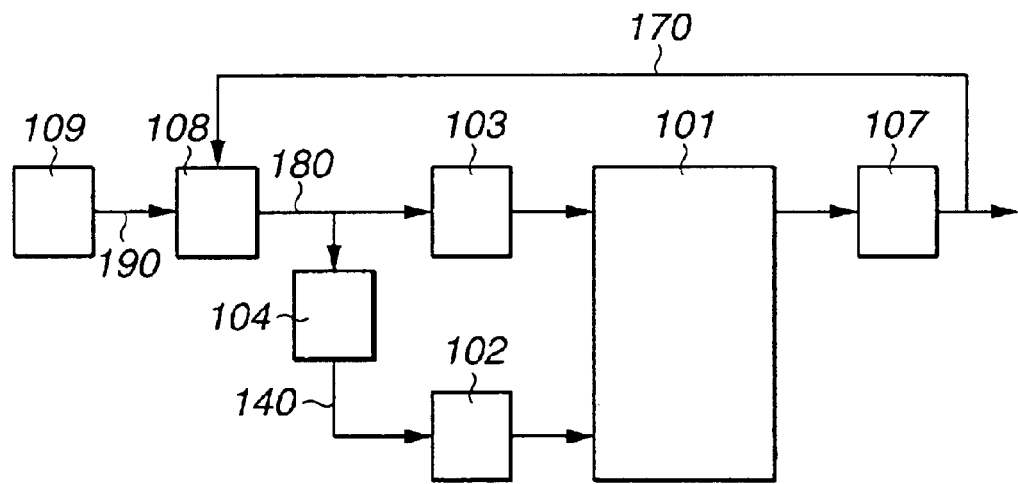
FIG. 19 is a diagram illustrating a ninth basic configuration.

FIG. 19 is a diagram illustrating a ninth basic configuration of a position control system according to a thirteenth embodiment of the present invention. In FIG. 19, position instruction-value generation means 109 for generating a target position instruction value 190 for the movable body, rigid-vibration measuring means 107 for measuring the rigid-body position 170 of the movable body, and rigid-vibration control means 108 for generating, based on the target position instruction value 190 and the rigid-body position 170, a driving instruction value 180 for communication to rigid-body driving means 103 are added to the configuration shown in FIG. 17. With this configuration, the position of a movable body 101 can be precisely controlled.

Figure 26:
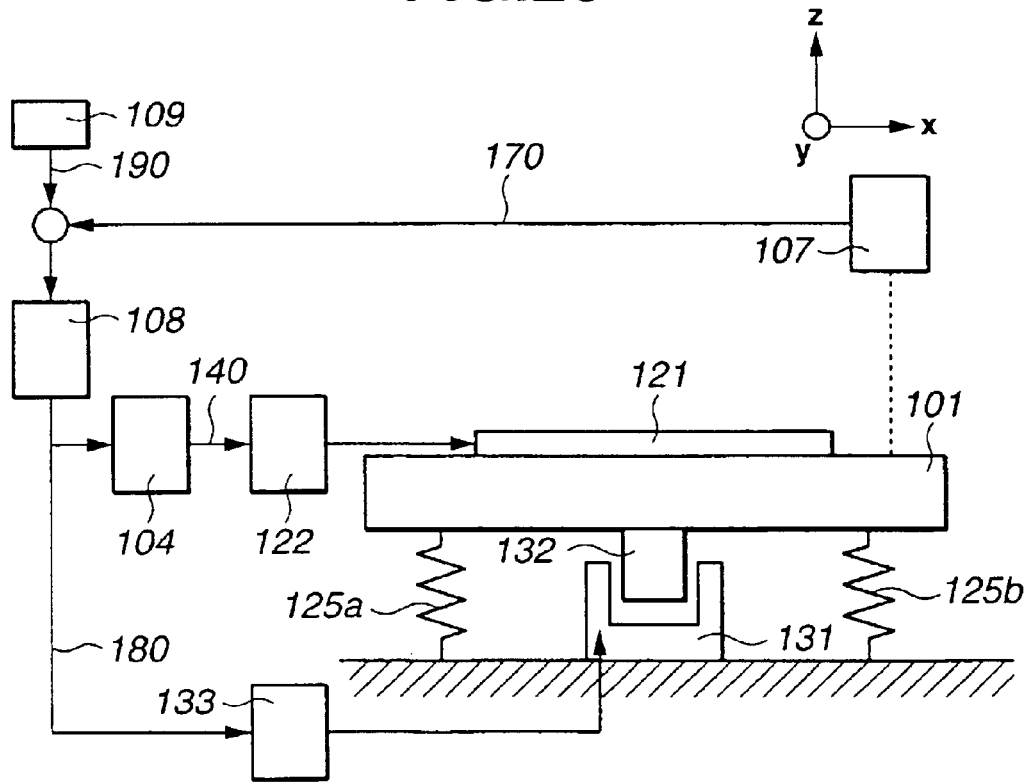
FIG. 26 is a diagram illustrating the configuration of a thirteenth embodiment of the present invention.

FIG. 26 illustrates a specific example in which a position control system is added to the stage control system shown in FIG. 23. The position of a stage 101 in the z direction is measured using, for example, laser interferometers, linear encoders or the like. The rigid-vibration control means 108 outputs a rigid-body driving signal 180 derived from the measured rigid-body position 170 and the target-position instruction value 190 generated by the stage-position instruction-value generation means 109. The rigid-body driving-force instruction value 180 is input to both a power amplifier 133 for driving the linear motors, serving as the rigid-body driving means 103, and the elastic-vibration compensator 104. A current amplified by the power amplifier 133 is supplied to a coil, serving as a stator 131 of the linear motor. An external force is applied by interaction with a permanent magnet, serving as a rotor 132, to move the stage in the z direction. The elastic-vibration compensator 104 estimates elastic vibration of the stage caused by an external force applied to the stage by the linear motor, obtains an internal force to suppress elastic vibration, and outputs the driving instruction value 140 to the amplifier 122 for supplying the piezoelectric element 121, serving as the elastic-vibration driving means 102, with electric power. According to such a configuration, the position of the stage 101 can be controlled by the linear motor in a state in which elastic vibration of the stage 101 is minimized.

In the position control system of the thirteenth embodiment, which does not have a configuration to suppress elastic vibration, since the driving force of the linear motor changes the position of the stage 101 and also generates elastic vibration of the stage 101, the control band of a control loop of the position of the stage 101 is restricted by a resonance frequency due to elastic vibration. Accordingly, it is difficult to realize very precise control. However, by providing the system shown in FIG. 26, it is possible to suppress elastic vibration. As a result, it is possible to maintain the gain of the position control system to a high value, and realize a very high speed and very precise position control system.

Fourteenth Embodiment

Figure 20:
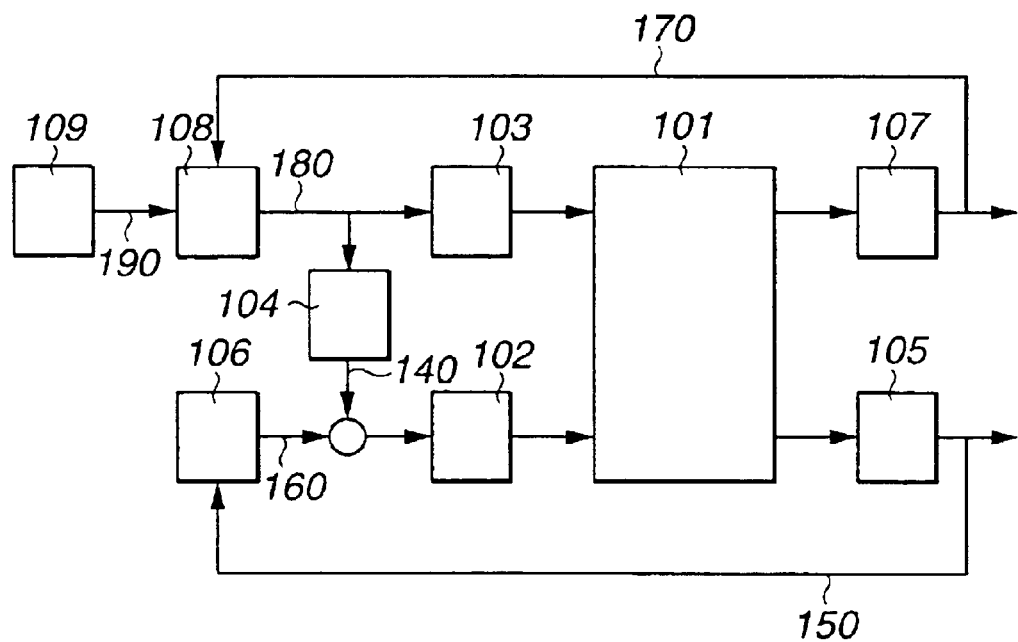
FIG. 20 is a diagram illustrating a tenth basic configuration.

As in the thirteenth embodiment, by adding a position control system to the outside of the configuration shown in FIG. 18, a position control system shown in FIG. 20 according to a fourteenth embodiment of the present invention can be provided. In the system shown in FIG. 20, a control loop is provided in which elastic vibration 150 is detected by elastic-vibration measuring means 105, and the detected value is fed back to elastic-vibration driving means 102 via elastic-vibration control means 106. Accordingly, the system shown in FIG. 20 can realize a position control system having a higher performance to suppress elastic vibration generated by disturbance, compared with the system shown in FIG. 3.

Fifteenth Embodiment

In each of the configurations in the thirteenth and fourteenth embodiments, the driving instruction value 180 for the rigid-body driving means 103 is used as a driving instruction value for the elastic-vibration compensator 104. In these configurations, since a value close to a force actually applied to the movable body is used, the correction value 140 generated by the elastic-vibration compensator 104 can be exactly obtained. However, in these configuration, there is the possibility that the system becomes instable. The reason will now be described with reference to FIG. 19 illustrating the configuration of the thirteenth embodiment.

In FIG. 19, the flow of a signal in a position control system is as follows. Rigid-vibration control means 108 determines a driving-force instruction value 180 for rigid-body driving means 103 from a target-position instruction value 190 generated by rigid-body-position instruction-value generation means 109 and a movable-body position 170 measured by rigid-vibration measuring means 107. When the driving instruction value 180 is input to the rigid-body driving means 103, an external force 130 is generated to move a movable body 101. The loop of such a signal original in the position control system will be termed a "loop 1".

The driving instruction value 180 output from the rigid-vibration control means 108 is also input to the elastic-vibration compensator 104, which outputs a driving-force instruction value 140. The driving-force instruction value 140 is input to elastic-vibration driving means 102, which generates an internal force 120 to cause elastic deformation in the movable body 101. At that time, as a result of elastic deformation of the movable body 101, the rigid-vibration measuring means 107 measures a signal in which elastic vibration is superposed on rigid vibration. A measured value 170 is input to the rigid-vibration control means 108, which outputs the driving instruction value 180. The driving instruction value 180 is input to the elastic-vibration compensator 104. Such a secondary loop will be termed a "loop 2". Interference between the loop 1 and the loop 2 sometimes degrade stability, and the system becomes instable in the worst case. This problem may also arise in the system of a twentieth embodiment of the present invention. In the system of the twentieth embodiment, since a loop 3 in which elastic deformation measured by elastic-vibration measuring means 105 is fed back to elastic-vibration driving means 102 via elastic-vibration control means 106, the problem of stability is more complicated.

As described above, when a position control system is added to the outside of the configuration of the eleventh embodiment, the problem in stability of the control system may arise. In order to avoid this problem, a configuration shown in FIG. 21 will now be proposed.

Figure 21:
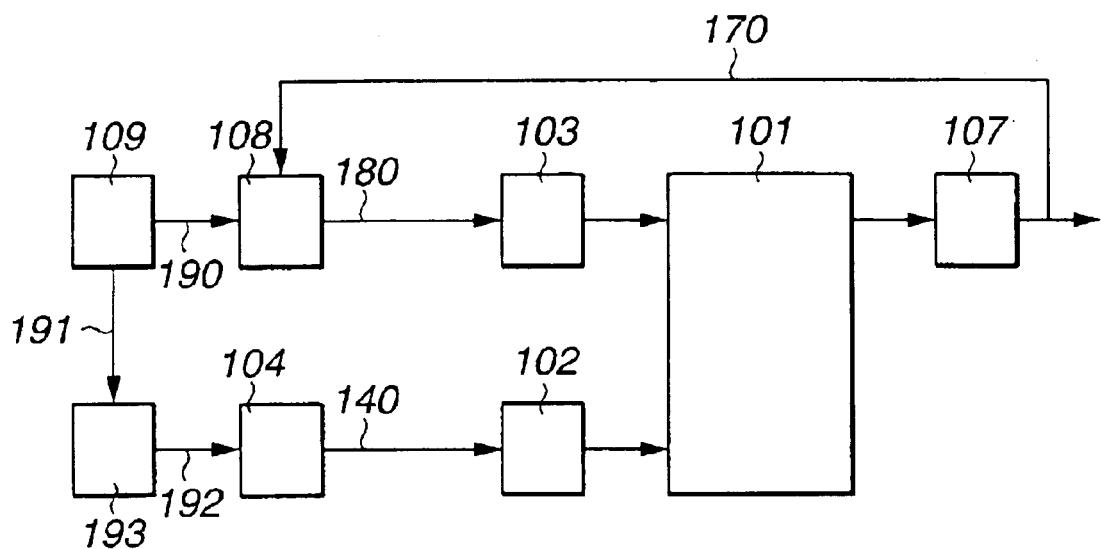
FIG. 21 is a diagram illustrating an eleventh basic configuration.
Figure 22:
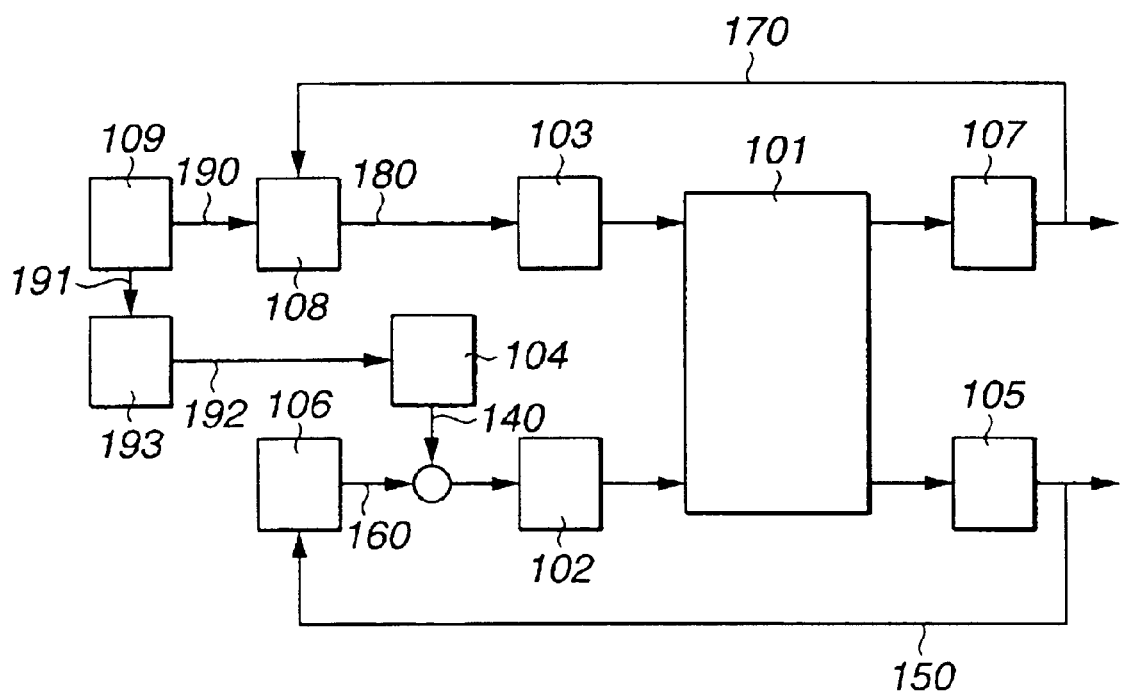
FIG. 22 is a diagram illustrating a twelfth basic configuration.

In FIG. 21, instead of inputting a driving signal 180 of rigid-vibration control means 108 to elastic-vibration compensator 104, a position-instruction-value generation means 109 has the function of generating an acceleration signal 191 corresponding to a target-position instruction value 190. The acceleration signal 191 is input to target conversion means 193, which generates a target driving force 192, and the generated target driving force 192 is input to the elastic-vibration compensator 104. The target conversion means 193 has the function of estimating a force to be generated by rigid-body driving means 103 from the target acceleration 191 to a rigid body. In the system of the thirteenth embodiment having one degree of freedom, it is only necessary that the target conversion means 193 multiplies the acceleration signal 191 by the mass of the movable body 101. In the system of a seventeenth embodiment of the present invention having multiple degrees of freedom, however, the target conversion means 193 must perform calculation of estimating the driving force to be actually generated by solid-body driving means from an instruction value for the position of the rigid body.

Originally, the driving signal 180 and the target driving force 192 have different values. However, the driving signal 180 and the target driving force 192 have similar values when:

(1) connection rigidity between a movable body and another member connected to the movable body is low; and (2) the response property of a control system for controlling the movable body is sufficiently excellent, DUDE.

For example, in the configuration shown in FIG. 26, when the rigidity of springs 25a and 25b for supporting a movable body 101 is sufficiently low, and the response property of a position control system can be sufficiently excellent, since a force applied to the movable body substantially coincides with a force obtained by multiplying acceleration corresponding to a target-position instruction value by the mass of the movable body 101, the target driving force 192 can be used instead of the driving signal 180.

Sixteenth Embodiment

In general, in a state in which gravity is exerted, in order to support the weight of a movable body, the movable body is supported by some type of springs. For example, in the eleventh embodiment shown in FIG. 23, springs are disposed below the stage. In such a case, if the rigidity of the sprigs is high, elastic vibration is greatly influenced by the springs, resulting in difficulty in determination of a correction value by the elastic-vibration compensator. Accordingly, by minimizing the rigidity of the springs for canceling gravity, it is possible to provide a system having an excellent property to suppress elastic vibration. In the configuration of the fifteenth embodiment, it is also possible to realize a system having an excellent property to suppress elastic vibration, because the driving instruction value 180 and the target driving force 192 have closer values as the springs are softer.

Seventeenth Embodiment

Figure 27:
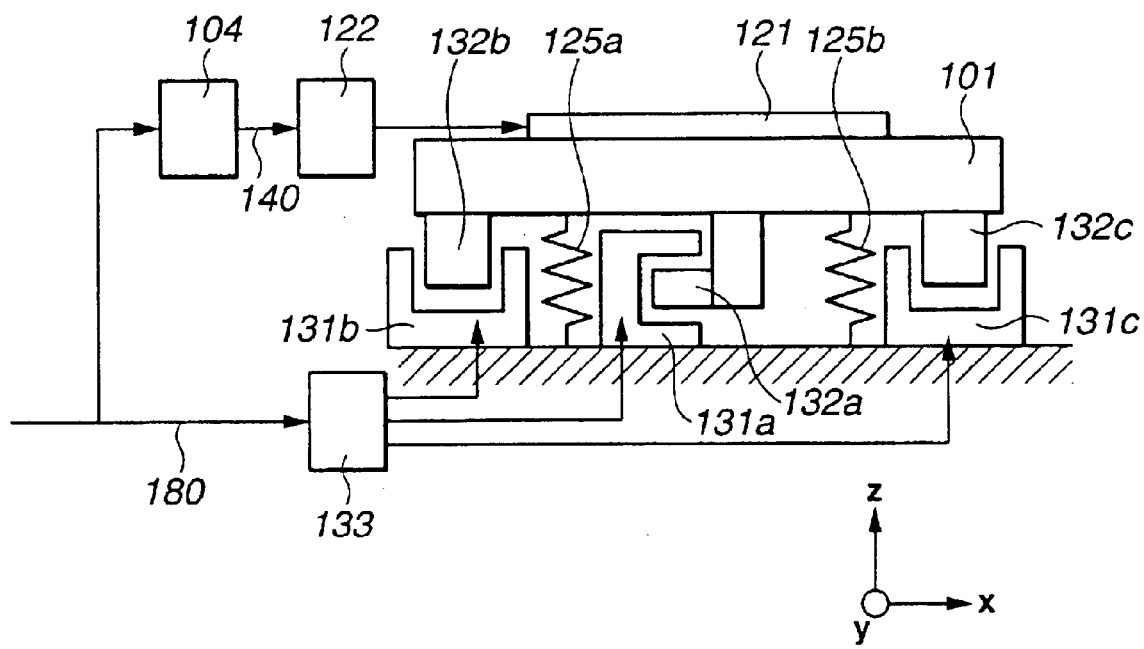
FIG. 27 is a diagram illustrating the configuration of a fourteenth embodiment of the present invention.

FIG. 27 illustrates a configuration when the posture of a stage is controlled with three degrees of freedom, i.e., Z, X and Θy, making the position of the center of gravity of the stage a reference. In order to control the posture of the stage with the three degrees of freedom, one central linear motor a and two side linear motors b, c are provided in the x direction and the z direction, respectively, on the stage, and three forces are controlled. A central linear motor a includes a stator 131a and a rotor 132a, and generates a thrust Fx in the x direction. Side linear motors b, c include stators 131b, 131c, and rotors 132b, 132c, and generate thrusts Fz1 and Fz2 in the z direction, respectively. In this configuration, since external forces are applied to a movable body 101, serving as an object to be controlled, from a plurality of directions, elastic vibration tends to be more easily generated. To compensate, an elastic-vibration compensator 104 generates a driving-force instruction value 140, which is communicated to elastic-vibration driving means 102, and three driving instruction values are then communicated to three rigid-body driving means 103.

In FIG. 27, a driving signal 180 is indicated by a single line. Actually, however, the driving signal 180 is a vector representing forces to be generated by three linear motors in order to generate driving forces with the three degrees of freedom, i.e., Z, X and Θy. For example, the vector is represented as (Fz1, Fx, Fz2). The elastic-vibration compensator 104 estimates elastic vibration when these forces are applied to the stage 101, obtains an internal force appropriate for suppressing a first-order elastic vibration mode, and instructs an amplifier 122 for supplying a piezoelectric element 121, serving as elastic-vibration driving means 102, with electric power.

Eighteenth Embodiment

Figure 28:
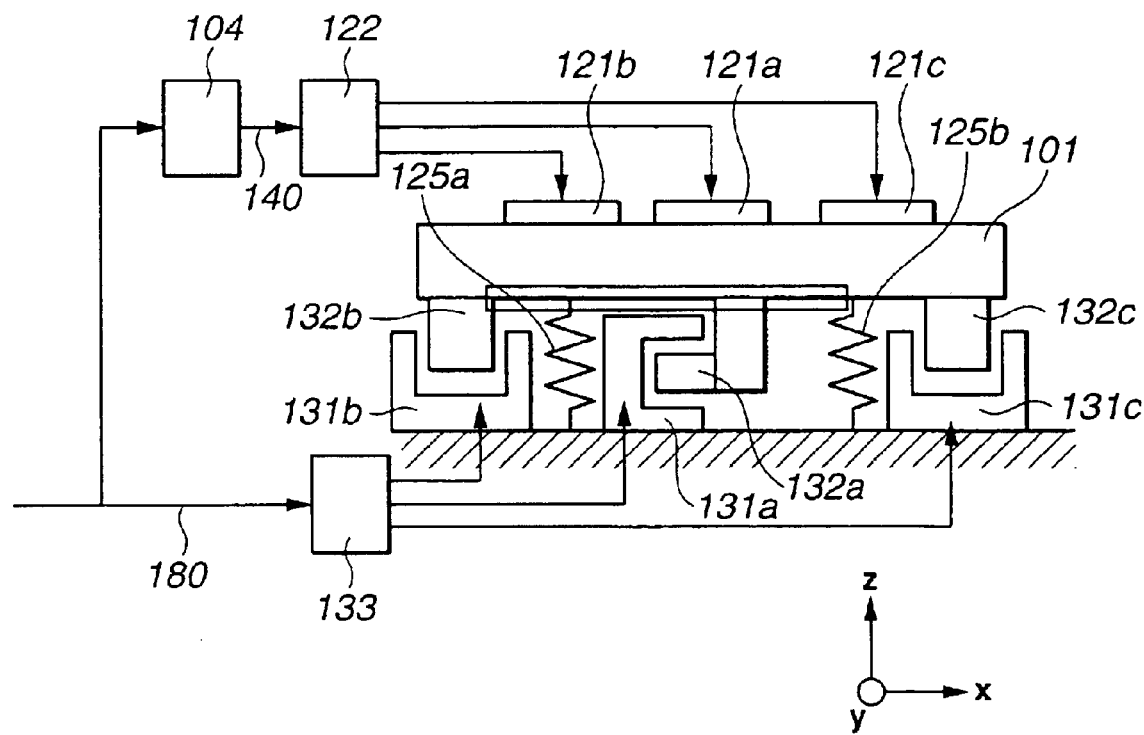
FIG. 28 is a diagram illustrating the configuration of a fifteenth embodiment of the present invention.
Figure 29A:
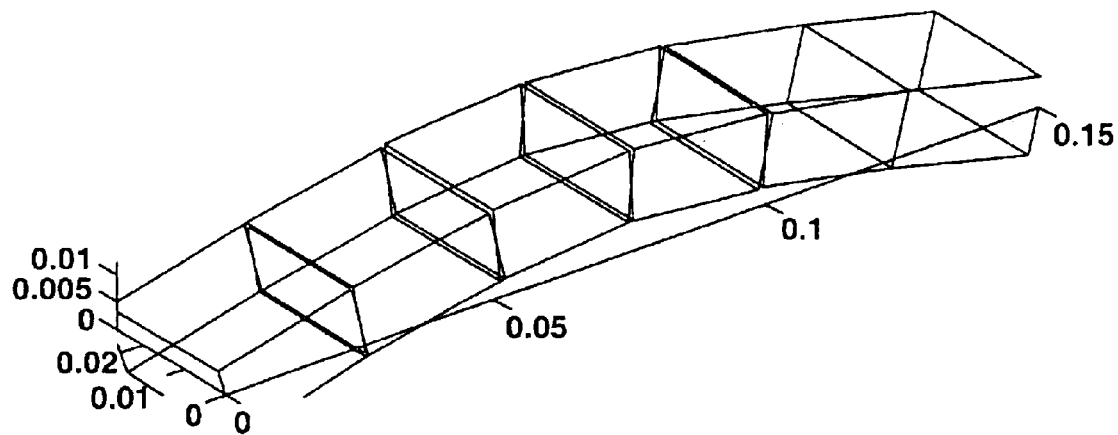
FIGS. 29A–29C are diagrams illustrating elastic vibration modes of a beam.
Figure 29B:
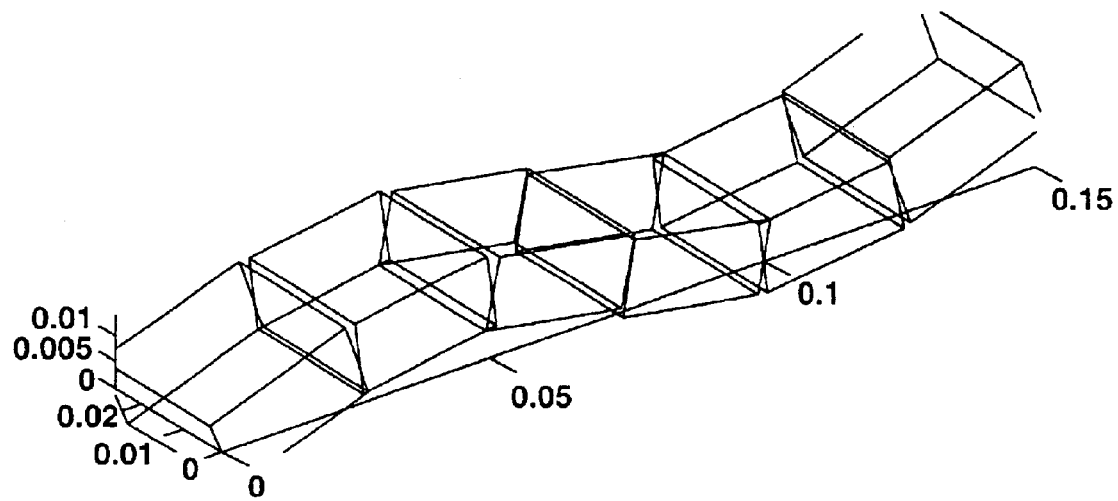
Figure 29C:
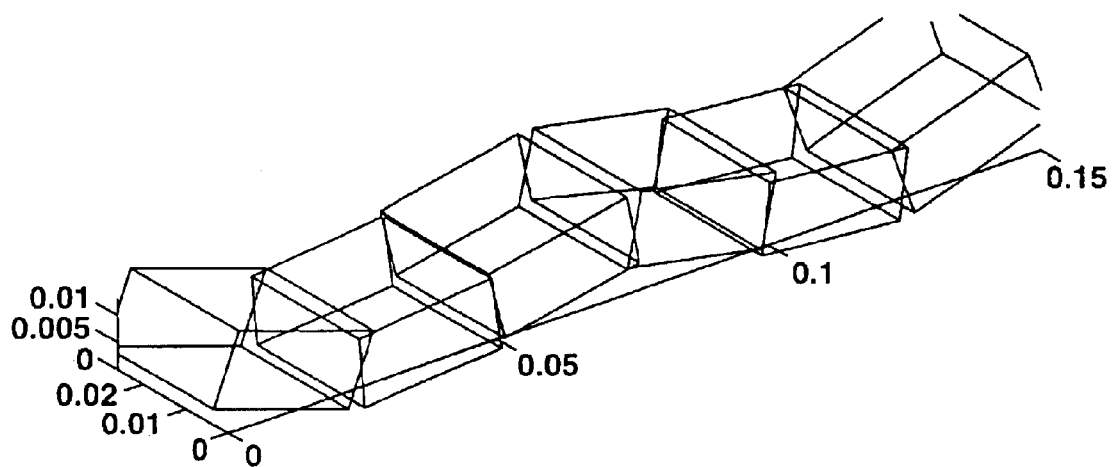

For example, in the eleventh or twelfth embodiment, the method for controlling elastic vibration by bonding the piezoelectric element 121, serving as the elastic-vibration driving means 102, at the center of the beam that is long in the x direction has been shown. Elastic vibration modes of the beam includes infinitely-high-order elastic vibration modes. In most cases, however, vibration modes that cause actual problems are some of low-order vibration modes. FIGS. 29A–29C illustrate low-order elastic vibration modes of the beam. FIGS. 29A, 29B and 29C illustrate a first-order mode, a second-order mode, and a third-order mode among elastic vibration modes of the beam, respectively. When bonding elastic-vibration driving means 2 at the center of the beam, only a first-order elastic-vibration mode can be suppressed, although a third-order mode also has a slight attenuation effect. By providing a plurality of elastic-vibration driving means 102 on an object to be controlled, it is possible to suppress a plurality of elastic vibration modes. For example, as shown in FIG. 28, by bonding piezoelectric elements 121a, 121b and 121c, serving as elastic-vibration driving means 102, at three equally divided portions in the longitudinal direction of the beam, it is possible to also suppress second-order and third-order elastic vibration modes. In a position control system of a stage shown in FIG. 28, in order to control the position of the stage, one central linear motor a and two side linear motors b, c are used in the x direction and in the z direction, respectively, as rigid-vibration driving means 103. Accordingly, second-order and third-order modes as well as a first-order mode tend to be excited as elastic vibration modes. An elastic-vibration compensator 104 determines an instruction value for the three piezoelectric elements 121a, 121b, 121c, serving as the elastic-vibration driving means 102, from a driving instruction 180 for the three linear motors a, b, c.

Nineteenth Embodiment

It is relatively easy to calculate a value to cancel elastic deformation due to an internal force generated when a specific force is applied to a specific position of a movable body by an internal force of driving means bonded at another position, when the shape and restriction conditions of the movable body are simple. However, when the shape and restriction conditions are complicated, the calculation is difficult. The elastic-vibration compensator 104 must obtain an applied external force and an internal force to cancel elastic deformation due to the external force. Although the configuration of the elastic-vibration compensator 104 can be sometimes realized with a simple proportional constant, determination of an equation (compensation function) is sometimes difficult. In such a case, a method is effective in which a compensation function is obtained in advance by an experiment or by using FEM (finite element method) analysis, the compensation function is stored in a computer as a conversion table, and the elastic-vibration compensator 104 is realized by the conversion table.

Twentieth Embodiment

As described in the fifteenth embodiment, in the configurations of FIGS. 19 and 20, the system becomes sometimes unstable. In the fifteenth embodiment, in order to solve this problem, a method has been proposed in which the target driving force 192 generated by the rigid-body-position instruction-value generation means 109 and the target conversion means 193 is used instead of the output 180 of the rigid-vibration control means 108 that is an internal signal of the system.

In order to stabilize the system while using the output 180 of the rigid-vibration control means 108 as in the thirteenth and fourteenth embodiments, for example, a method is effective in which a compensator having dynamic characteristics of a high-frequency cut filter or the like is inserted. In order to maintain the expected characteristics of the loop 1 and loop 3 shown in the fifteenth embodiment, it is appropriate to dispose this compensator at a stage posterior to the elastic-vibration compensator 104 in series.

Twenty-first Embodiment

The elastic-vibration compensator 104 is aimed at causing elastic deformation by applying an internal force to the movable body 101. As means for generating a force, although an electromagnetic force generated by a linear motor or the like may be used, a piezoelectric element is most suitable. In application of the present invention, the elastic-vibration driving means 102 is for causing deformation in an elastic member, and it is necessary to generate a large force although deformation may be small. In a linear motor, in order to generate a large force, a large current must be used, thereby causing large heat generation and the like. Of course, it is also possible to use an element for generating an electromagnetic force, such as a linear motor or the like, as the elastic-vibration driving means 102, depending on the use.

Twenty-second Embodiment

In a twenty-second embodiment of the present invention, the tenth basic configuration (FIG. 20) is applied to a wafer stage of an exposure apparatus (a semiconductor exposure apparatus in this case) for manufacturing micro-devices, such as semiconductor devices or the like. FIG. 30A is a schematic diagram illustrating the configuration of a semiconductor exposure apparatus. FIGS. 30B–30D illustrate the details of a tilt stage. In the following description, positions (x, y, z) in translational three-axes directions with respect to a reference coordinate system and angles of rotation (θx, θy, θz) around translational three axes are called the positions of six degrees of freedom. The configuration and the operation of a high-speed and high-precision position control system will now be described with reference to FIGS. 30A–30D.

In FIG. 30A, a surface plate 141 is supported via dumpers 147a from a floor 149. A Y stage 143 is movable in the y direction on the reference surface of the surface plate 141 by a Y linear motor 134 for generating a thrust in the y direction along a fixed guide 142 fixed on the surface plate 141. The surface plate 141, the fixed guide 142, and the Y stage 143 are connected through air via air pads 144a and 144b, each serving as a hydrostatic bearing, in a non-contact state. The Y stage 143 has an x-direction guide, and guides an X stage 145 mounted on the Y stage 143 in the x direction. An X-linear-motor stator for generating a force in the x direction is provided on the Y stage 143, in order to drive the X stage 145 in the x direction in cooperation with an X-linear-motor rotor provided on the X stage 145. The surface plate 141, the x-direction guide and the X stage 145 are connected through air via air pads 144c, serving as hydrostatic bearings, in a non-contact state.

A tilt stage 112 is mounted on the X stage 145. In the twenty-second embodiment, the entirety of the tilt stage includes a stage substrate (top plate), a mirror for a laser interferometer, a linear motor for fine movement, and the like. The tilt stage 112 includes a stage substrate 111 having a wafer chuck for holding a wafer 113, serving as an object to be exposed. Measurement mirrors 172a, 172b, which are used for position measurement in six-axes directions using a barrel surface plate 148 of the stage as a reference, are provided on the stage substrate 111. The barrel surface plate 148 is supported by struts 146 via dumpers 147b. Laser interferometers 171 are provided at the barrel surface plate 148 side. Although in FIG. 30A, only two laser interferometers 171a, 171c for measuring x-direction and z-direction positions of the tilt stage 112 are shown, six laser interferometers at the minimum are provided in order to measure six-axes rigid-body positions of the tilt stage 112. Laser interferometers are separately provided in order to measure the positions of the X stage 145 and the Y stage 143. In the twenty-second embodiment, the tilt stage 112 is a six-axes fine-movement stage. The X stage 145 and the Y stage 143 operate as coarse-movement stages. That is, the X stage 145 and the Y stage 143 are designed so as to move with a large stroke although accuracy is not high. Conversely, the tilt stage 112 can perform a very precise operation although the movable stroke is small.

FIGS. 30B–30D illustrate the details of the tilt stage 112. FIGS. 30B and 30D represent the side and the back, respectively, of the tilt stage 112. Linear motors 132a–132h drive the tilt stage 112. Each of the linear motors 132a–132d generates a force in a horizontal direction, and each of the linear motors 132e–132h generates a force in a vertical direction. The tilt stage 112 performs movement in linear three-axes (x, y, and z) directions and rotation around three axes (θx, θy, θz) by the thrusts of the linear motors 32a–32h, in order to control six axes of rigid vibration. Piezoelectric elements 121a–121d are disposed as elastic-vibration driving means 102 for generating a force to bend the stage substrate 111. Piezoelectric elements 151a–151d are disposed at portions adjacent to the piezoelectric elements 121a–121d, respectively, as elastic-vibration measuring means 105 for measuring bending distortion. Elastic-vibration control means 106a–106d input velocities measured by the measuring means 151a–151d, and calculate and control forces generated by driving means 121a–121d, respectively.

Positioning of the X stage 145 and the Y stage 143, and positioning of the tilt stage 112 in six-axes directions are achieved by providing a servo system at each axis. Control (calculation) means (not shown) calculates driving instruction values for an x-direction linear motor and a y-direction linear motor, serving as actuators for the tilt stage 112 in the x direction and the y direction, respectively based on position information from the laser interferometers, and each of the X stage 145 and the Y stage 143 is driven according to the calculation. In the tilt stage 112, in order to control the position of the rigid body in six-axes directions, a position control system is separately provided.

FIG. 20 illustrates the configuration of a control system at the tilt stage 112 side. A stage-position instruction-value generation means 109 generates a target-position instruction 190 for six axes of the tilt stage 112. The x and y components of the instruction value are also used as instruction values for the X stage 145 and the Y stage 143, respectively. Rigid-vibration control means 108 determines rigid-vibration driving-force instruction values 180 for the linear motors 32a–32h, serving as rigid-vibration driving means 103, from the target-position instruction value 190 and tilt-stage six-axes measurement signals 170a–170e measured by the laser interferometers 171. An elastic-vibration compensator 104 outputs an instruction value to elastic-vibration driving means 102 so as to suppress elastic deformation of the stage substrate 111, using the rigid-vibration driving-force instruction value 180 output from the rigid-vibration control means 108. Elastic-vibration control means 106 improves the attenuation property of elastic vibration of the top plate by feeding back the velocity component of elastic vibration, as described above. Since elastic vibration when driving the tilt stage 112 can be effectively suppressed according to the effects of the above-described elements for controlling elastic vibration, the position control system for controlling rigid vibration of the tilt stage 112 can increase the upper limit of a servo band, and thereby improve accuracy in position control of the tilt stage 112.

By controlling elastic vibration in the above-described manner, movement of a movable body at a higher speed and with a higher accuracy than in the conventional approach can be performed.

Other Embodiment

Figure 31:
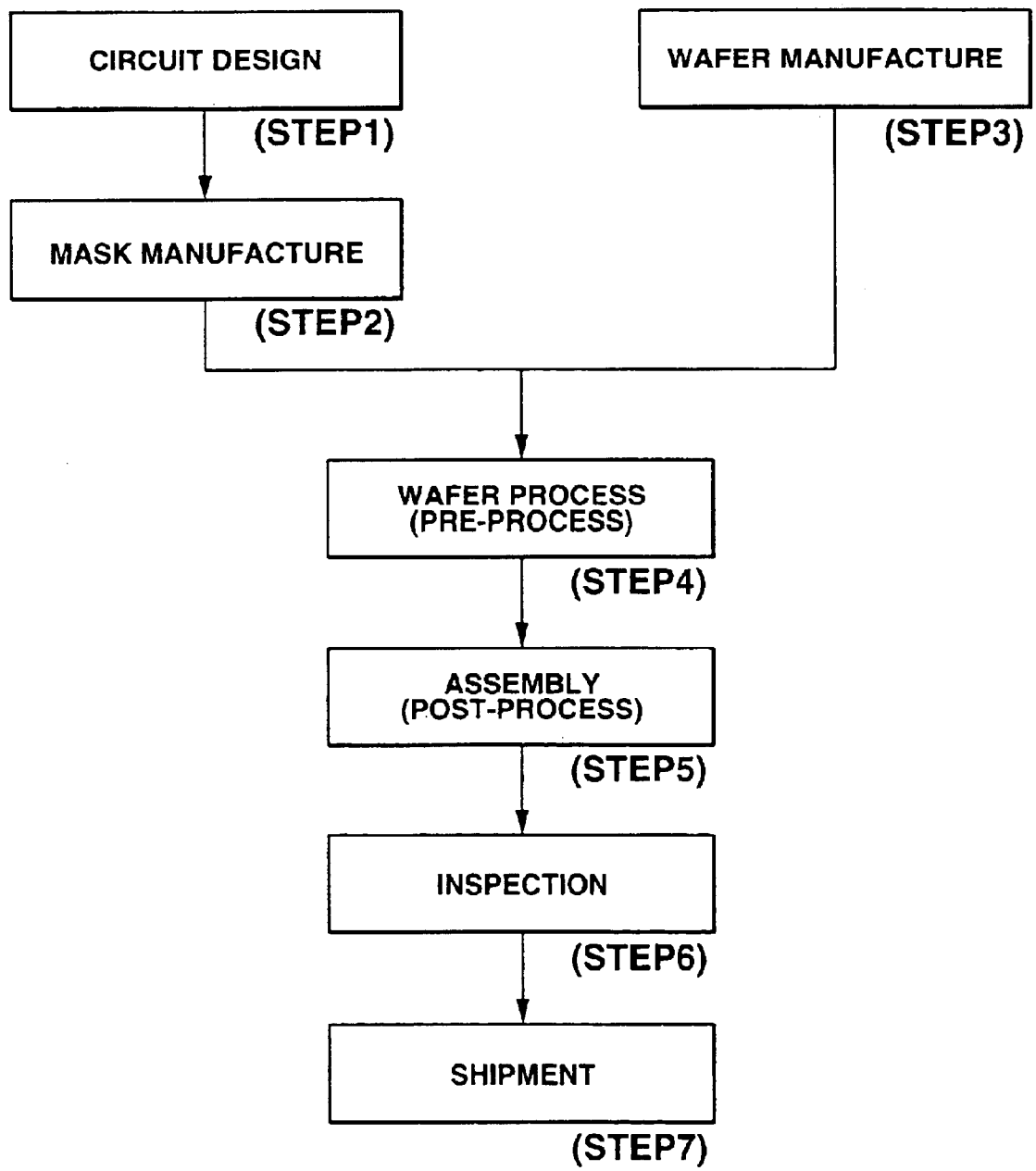
FIG. 31 is a flowchart illustrating a device manufacturing process.

Next, a description will be provided of a semiconductor-device manufacturing process utilizing the above-described exposure apparatus. FIG. 31 is a diagram illustrating the flow of the overall semiconductor-device manufacturing process.

In step 1 (circuit design), circuit design of semiconductor devices is performed. In step 2 (mask manufacture), masks are formed based on a designed circuit pattern. In step 3 (wafer manufacture), wafers are manufactured using a material, such as silicon or the like. Step 4 (wafer process) is called a pre-process, in which actual circuits are formed on the wafers by means of photolithography using the above-described exposure apparatus. The next step, step 5 (assembly) is called a post-process which manufactures semiconductor chips using the wafers manufactured in step 4, and includes an assembling process (dicing and bonding), a packaging process (chip encapsulation), and the like. In step 6 (inspection), inspection operations, such as operation-confirming tests, durability tests, and the like, of the semiconductor devices manufactured in step 5 are performed. The manufacture of semiconductor devices is completed after passing through the above-described processes, and the manufactured devices are shipped in step 7.

The wafer process in step 4 has the following steps: an oxidation step in which the surface of the wafer is oxidized; a CVD (chemical vapor deposition) step in which an insulating film is formed on the surface of the wafer; an electrode formation step in which electrodes are formed on the surface of the wafer by vacuum deposition; an ion implantation step in which ions are implanted into the wafer; a resist process step in which a photosensitive material is coated on the wafer; an exposure step in which the circuit pattern is exposed on the wafer after the resist process step using the above-described exposure apparatus; a developing step in which the wafer exposed in the exposure step is developed; an etching step in which portions other than the developed resist image are etched off, and a resist separation step in which the resist, which becomes unnecessary after the completion of the etching, is removed. By repeating these steps, a final circuit pattern made of multiple patterns is formed on the wafer.

The individual components shown in block outline in the drawings are all well known, per se, in the vibration control arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An apparatus for controlling motion of an object, said apparatus comprising:
   a first actuator for moving an object;
   an elastic-motion measuring unit for measuring elastic motion of the object;
   a rigid-motion measuring unit, distinct from said elastic-motion measuring unit, for measuring rigid motion of the object; and
   a control unit for controlling said first actuator based on elastic motion measured by said elastic-motion measuring unit and rigid motion measured by said rigid-motion measuring unit.

2. An apparatus according to claim 1, further comprising:
   a second actuator for suppressing elastic motion of the object,
   wherein said control unit controls said second actuator based on elastic motion measured by said elastic-motion measuring unit.

3. An apparatus according to claim 2, wherein said control unit comprises a prediction unit for predicting elastic motion of the object caused by said first actuator, and controls said second actuator based on a prediction made by said prediction unit.

4. An apparatus according to claim 2, wherein said second actuator comprises a piezoelectric element.

5. An apparatus according to claim 1, wherein said control unit comprises a prediction unit for predicting elastic motion of the object caused by said first actuator, and controls said first actuator based on a prediction made by said prediction unit.

6. An apparatus according to claim 1, wherein said elastic-motion measuring unit comprises a piezoelectric element.

7. An exposure apparatus for exposing a substrate to a pattern due to an original, said exposure apparatus comprising an apparatus defined in claim 1.

8. An exposure apparatus according to claim 7, wherein said exposure apparatus comprises a stage for holding one of the substrate and the original, as the object.

9. A device manufacturing method, comprising the steps of:
   exposing a substrate to a pattern due to an original using an exposure apparatus defined in claim 7; and
   developing the exposed substrate.

10. An apparatus for controlling motion of an object, said apparatus comprising:
   a first actuator for moving an object;
   a second actuator for suppressing elastic motion of the object; and
   a control unit for predicting elastic motion of the object caused by said first actuator and controlling at least one of said first and second actuators based on a prediction of elastic motion of the object caused by said first actuator.

11. An apparatus according to claim 10, further comprising:
an elastic-motion measuring unit for measuring elastic motion of the object,
wherein said control unit controls said second actuator based on elastic motion measured by said elastic-motion measuring unit.

12. An apparatus according to claim 10, further comprising:
a rigid-motion measuring unit for measuring rigid motion of the object,
wherein said control unit controls said first actuator based on rigid motion measured by said rigid-motion measuring unit.

13. An exposure apparatus for exposing a substrate to a pattern due to an original, said exposure apparatus comprising an apparatus defined in claim 10.

14. A device manufacturing method, comprising the steps of:
exposing a substrate to a pattern due to an original using an exposure apparatus defined in claim 13; and
developing the exposed substrate.

15. An exposure apparatus according to claim 13, wherein said exposure apparatus comprises a stage for holding one of the substrate and the original, as the object.

16. An apparatus for controlling motion of an object, said apparatus comprising:
a first actuator for moving an object;
a rigid-motion measuring unit for measuring rigid motion of the object; and
a control unit for predicting elastic motion of the object caused by said first actuator and controlling said first actuator based on rigid motion measured by said rigid-motion measuring unit and the predicted elastic motion.

17. An exposure apparatus for exposing a substrate to a pattern due to an original, said exposure apparatus comprising an apparatus defined in claim 16.

18. An exposure apparatus according to claim 17, wherein said exposure apparatus comprises a stage for holding one of the substrate and the original, as the object.

19. A device manufacturing method comprising the steps of:
exposing a substrate to a pattern due to an original using an exposure apparatus defined in claim 17; and
developing the exposed substrate.

* * * * *

UNITED STATES PATENT AND TRADEMARK OFFICE
CERTIFICATE OF CORRECTION

PATENT NO. : 6,881,963 B2
DATED : April 19, 2005
INVENTOR(S) : Hiroshi Ito

It is certified that error appears in the above-identified patent and that said Letters Patent is hereby corrected as shown below:

Column 19,
Line 13, "excellent, DUDE." should read -- excellent. --.

Signed and Sealed this

Eighteenth Day of April, 2006

JON W. DUDAS
*Director of the United States Patent and Trademark Office*